United States Patent
Yajima

(10) Patent No.: US 9,793,228 B2
(45) Date of Patent: Oct. 17, 2017

(54) SEMICONDUCTOR DEVICE AND METHOD OF MANUFACTURING THE SEMICONDUCTOR DEVICE

(71) Applicant: Renesas Electronics Corporation, Tokyo (JP)

(72) Inventor: Akira Yajima, Ibaraki (JP)

(73) Assignee: Renesas Electronics Corporation, Koutou-ku, Tokyo (JP)

( * ) Notice: Subject to any disclaimer, the term of this patent is extended or adjusted under 35 U.S.C. 154(b) by 0 days.

(21) Appl. No.: 15/186,903

(22) Filed: Jun. 20, 2016

(65) Prior Publication Data
US 2017/0062361 A1    Mar. 2, 2017

(30) Foreign Application Priority Data

Aug. 26, 2015    (JP) ................. 2015-167278

(51) Int. Cl.
*H01L 23/12*    (2006.01)
*H01L 23/00*    (2006.01)

(52) U.S. Cl.
CPC .............. *H01L 24/02* (2013.01); *H01L 24/03* (2013.01); *H01L 24/05* (2013.01); *H01L 24/43* (2013.01); *H01L 24/45* (2013.01); *H01L 24/49* (2013.01); *H01L 2224/024* (2013.01); *H01L 2224/0239* (2013.01); *H01L 2224/02315* (2013.01); *H01L 2224/02331* (2013.01); *H01L 2224/02373* (2013.01); *H01L 2224/04042* (2013.01); *H01L 2224/05008* (2013.01); *H01L 2224/05124* (2013.01); *H01L 2224/4502* (2013.01); *H01L 2224/45144* (2013.01); *H01L 2224/45147* (2013.01); *H01L 2924/01029* (2013.01); *H01L 2924/07025* (2013.01); *H01L 2924/364* (2013.01); *H01L 2924/365* (2013.01)

(58) Field of Classification Search
CPC ........ H01L 24/02; H01L 24/05; H01L 24/45; H01L 2224/45144; H01L 2224/45147; H01L 24/43; H01L 24/03; H01L 24/49; H01L 24/09; H01L 24/06
See application file for complete search history.

(56) References Cited

U.S. PATENT DOCUMENTS

| | | | | |
|---|---|---|---|---|
| 2014/0175602 | A1* | 6/2014 | Funaya | H01L 27/1203 257/531 |
| 2016/0035672 | A1* | 2/2016 | Funaya | H01L 27/0688 257/531 |
| 2016/0064344 | A1* | 3/2016 | Yajima | H01L 24/03 257/751 |

FOREIGN PATENT DOCUMENTS

JP    2003-229450 A    8/2003

* cited by examiner

*Primary Examiner* — A. Sefer
(74) *Attorney, Agent, or Firm* — Sughrue Mion, PLLC

(57) ABSTRACT

Reliability of a semiconductor device is improved. A slope is provided on a side face of an interconnection trench in sectional view in an interconnection width direction of a redistribution layer. The maximum opening width of the interconnection trench in the interconnection width direction is larger than the maximum interconnection width of the redistribution layer in the interconnection width direction, and the interconnection trench is provided so as to encapsulate the redistribution layer in plan view.

16 Claims, 25 Drawing Sheets

SEMICONDUCTOR DEVICE AND METHOD OF MANUFACTURING THE SEMICONDUCTOR DEVICE

CROSS-REFERENCE TO RELATED APPLICATIONS

The disclosure of Japanese Patent Application No. 2015-167278 filed on Aug. 26, 2015 including the specification, drawings and abstract is incorporated herein by reference in its entirety.

BACKGROUND

The present invention relates to a semiconductor device and a technique for manufacturing the semiconductor device. For example, the invention relates to a technology that is effectively applied to a semiconductor device including a redistribution layer, and relates to a technique for manufacturing the semiconductor device.

Japanese Unexamined Patent Application Publication No. 2003-229450 describes a technique, in which an insulating film covering an aluminum pad has an opening that exposes part of a surface of the aluminum pad, and a recess is provided on a side face of the opening. With the technique, it is further described that a metal interconnection layer is provided so as to protrude from the inside of the opening including the recess.

SUMMARY

For example, for semiconductor devices for use in consumer products typified by household electric appliances and communication devices, development trend includes low power consumption, small size, and low cost. For semiconductor devices for use in vehicles, in addition to such a development trend, it is necessary to improve reliability of high-voltage operation under high-temperature environment. In this regard, an inexpensive copper (Cu) wire is examiningly used in place of expensive gold (Au) wire from the viewpoint of cost reduction. In such a case, since the copper wire is harder than the gold wire, a pad to be coupled to the wire is easily damaged. It is therefore examined that when a copper wire is used, the copper wire is not directly coupled to the pad, and instead, for example, a redistribution layer including a copper interconnection to be coupled to the pad is provided, and is then coupled to the copper wire. According to such a redistribution layer structure, on resistance of a power transistor can be reduced by the thick redistribution layer, and chip area can be reduced through an interconnection layout design using the redistribution layer. Furthermore, cost reduction can be achieved by using the coupling structure with the inexpensive copper wire, and heat radiation can be increased by large areal occupancy of the redistribution layer.

With the current redistribution layer structure, however, the inventors have found that even if a distance between redistribution layers is designed to maintain a dielectric strength voltage between the redistribution layers, the dielectric strength voltage according to a design value cannot be provided in an actual redistribution layer structure. That is, investigation for improvement is necessary for the current redistribution layer structure from the viewpoint of providing the dielectric strength voltage.

Other issues and novel features will be clarified from the description of this specification and the accompanying drawings.

According to one embodiment of the invention, there is provided a semiconductor device, in which a slope is provided on a side face of an interconnection trench in sectional view in an interconnection width direction of a redistribution layer. The maximum opening width of the interconnection trench in the interconnection width direction is larger than the maximum interconnection width of the redistribution layer in the interconnection width direction, and the interconnection trench is provided so as to encapsulate the redistribution layer in plan view.

According to the one embodiment, reliability of the semiconductor device can be improved.

DETAILED DESCRIPTION

Although each of the following embodiments may be dividedly described in a plurality of sections or embodiments for convenience as necessary, they are not unrelated to one another except for the particularly defined case, and are in a relationship where one is a modification, a detail, supplementary explanation, or the like of part or all of another one.

In each of the following embodiments, when the number of elements (including the number, a numerical value, amount, and a range) is mentioned, the number is not limited to a specified number except for the particularly defined case and for the case where the number is principally clearly limited to the specified number. In other words, the number may be not less than or not more than the specified number.

In each of the following embodiments, it will be appreciated that a constitutional element (including an element step) of the embodiment is not necessarily indispensable except for the particularly defined case and for the case where the constitutional element is probably indispensable in principle.

Similarly, in each of the following embodiments, when a shape of a constitutional element, a positional relationship, and the like are described, any configuration substantially closely related to or similar to such a shape or the like should be included except for the particularly defined case and for the case where the configuration is probably not included in principle. The same holds true in the above-described numerical value and range.

In all drawings for explaining the following embodiments, the same components are designated by the same numeral, and duplicated description is omitted. A plan diagram may also be hatched for better viewability.

First Embodiment

Investigation for Improvement

Room for improvement in the related art is now described. The term "related art" mentioned herein refers to an art including a problem that has been newly found by the inventors, which is described with the view to a technique (unknown technique) prerequisite for the novel technical idea while being not a known prior art.

Figure 1:
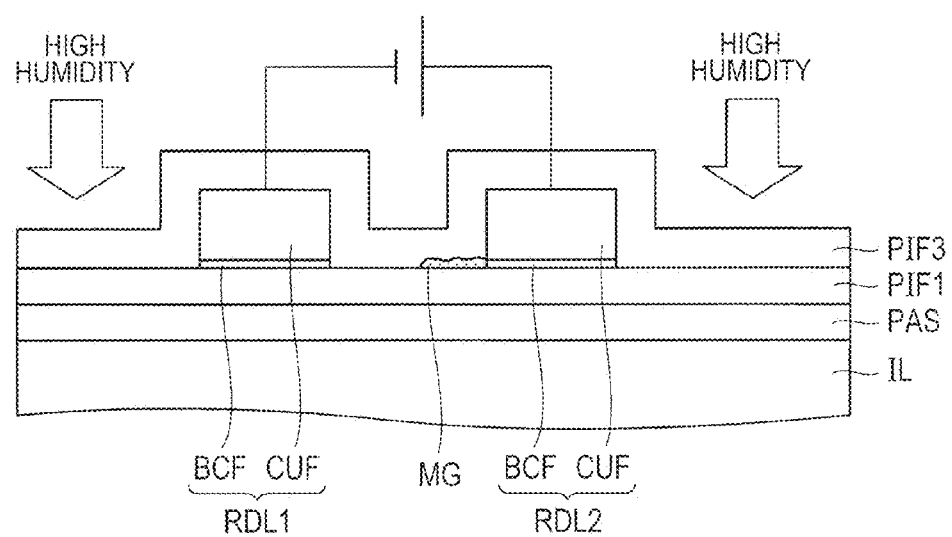
FIG. 1 is a view to explain room for improvement in the related art, which schematically illustrates redistribution layers disposed adjacent to each other.

FIG. 1 is a view for explaining room for improvement in the related art, which schematically illustrates a redistribution layer RDL1 and a redistribution layer RDL2 disposed to be adjacent to each other. FIG. 1, a passivation film PAS is provided on an interlayer insulating film IL, and a polyimide film PIF1 is provided on the passivation film PAS. The redistribution layer RDL1 and the redistribution layer RDL2 are disposed on the polyimide film PIF1 so as to be separated from each other. Each of the redistribution layers RDL1 and RDL2 includes, for example, a barrier conductor film BCF that serves to prevent diffusion of copper, and a copper film CUF provided on the barrier conductor film BCF. Furthermore, a polyimide film PIF3 is provided so as to cover the redistribution layer RDL1 and the redistribution layer RDL2.

As illustrated in FIG. 1, in the related art, for example, the barrier film BCF that prevents diffusion of copper does not exist on a side face of the redistribution layer RDL2; hence, copper migration MG easily occurs along an interface between the polyimide films PIF1 and PIF3. The inventors have elucidated the mechanism of occurrence of such copper migration MG, and the mechanism is now described with reference to FIG. 1.

In FIG. 1, for example, if the semiconductor device is placed in a high-humidity environment, the polyimide film PIF3 being an organic insulating film takes up moisture because of its hygroscopic property. As a result, water is condensed in an interface between the polyimide films PIF3 and PIF1 illustrated in FIG. 1. For example, if a high electric potential is applied between the redistribution layers RDL1 and RDL2 in this situation, the copper film CUF exposed from a side face of the redistribution layer RDL2 on a plus potential side (positive potential side) is corroded due to the water in the interface between the polyimide films PIF1 and PIF3 and an electric field associated with the application of the high-electric field. Copper ions caused by corrosion of the copper film CUF are drifted to a minus potential side (negative potential side) and deposited thereon. As a result, as illustrated in FIG. 1, copper migration MG occurs from the left side face of the redistribution layer RDL2 toward the redistribution layer RDL1.

Hence, an insulating distance between the redistribution layers RDL1 and RDL2 becomes shorter than the distance between the redistribution layers RDL1 and RDL2 due to the copper migration extending from the left side face of the redistribution layer RDL2. This means a reduction dm withstand voltage between the redistribution layers RDL1 and RDL2. In other words, in the related art, the dielectric strength voltage is reduced between the redistribution layers RDL1 and RDL2 adjacent to each other by the copper migration MG along the interface between the polyimide films PIF1 and PIF3. Specifically, even if the distance between the redistribution layers RDL1 and RDL2 is designed such that the dielectric strength voltage between the redistribution layers Rpm and RDL2 can be maintained in consideration of the largest potential difference applied between the redistribution layers RDL1 and RDL2, the effective insulating distance between the redistribution layers RDL1 and RDL2 becomes shorter due to the copper migration MG. As a result, in the related art, the dielectric strength voltage according to the design value cannot be provided due to the copper migration MG, causing a reduction in reliability of the semiconductor device.

In this way, the related art has room for improvement in the reduction dielectric strength voltage between the redistribution layers RDL1 and RDL2 adjacent to each other. In other words, the related art has room for improvement from the viewpoint of improving reliability of the semiconductor device. In the first embodiment, therefore, means are devised for the room for improvement in the related art. The technical idea of the first embodiment, in which such means are devised, is now described.

Planar Layout Configuration of Semiconductor Chip

Figure 2:
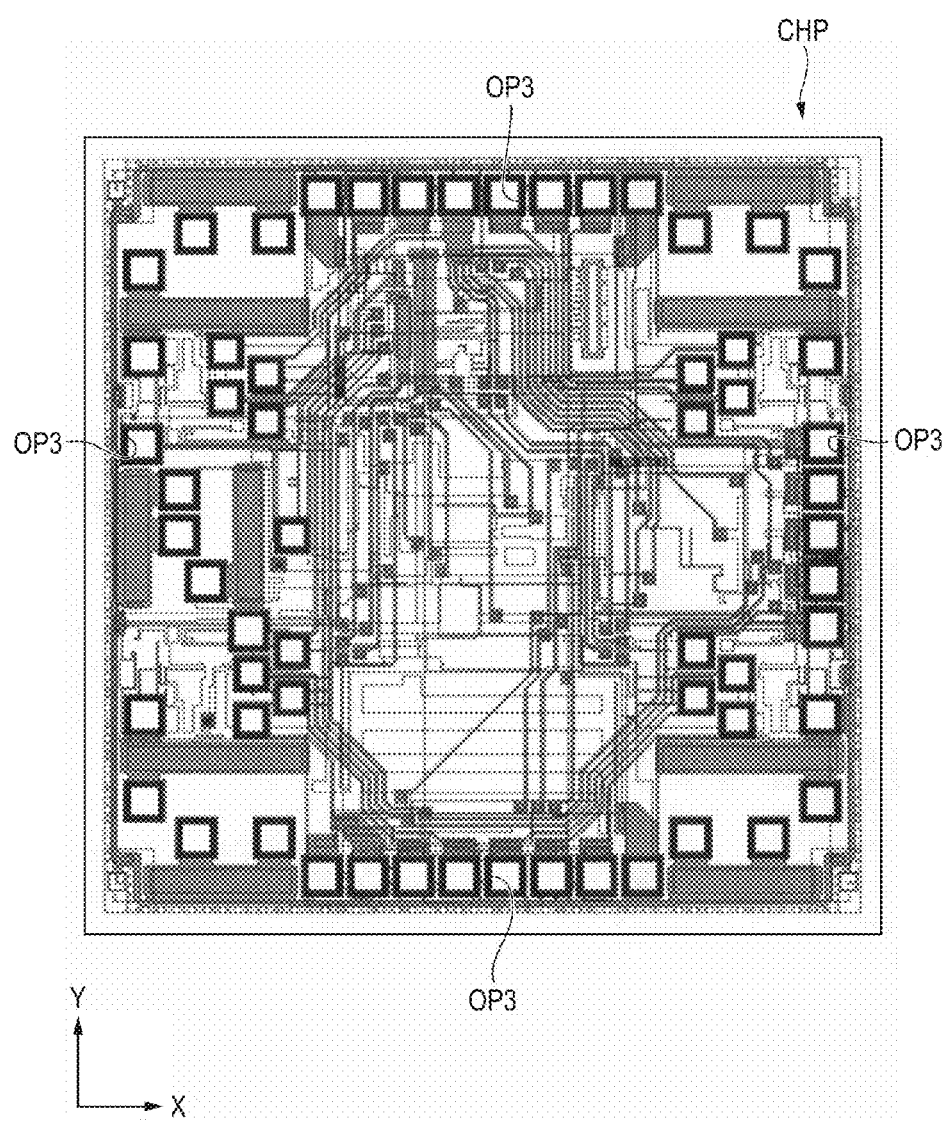
FIG. 2 is a plan view illustrating an exemplary planar layout configuration of a semiconductor chip in a first embodiment.

FIG. 2 is a plan view illustrating an exemplary planar layout configuration of a semiconductor chip CHP of the first embodiment. As illustrated in FIG. 2, the semiconductor chip CHP of the first embodiment has a rectangular shape as its planar shape. A plurality of quadrilaterals enclosed by thick lines in an inner region of the semiconductor chip CHP each correspond to an opening OP3 exposing part of a redistribution layer, and a gold film provided on the redistribution layer is exposed from the opening OP3. A copper wire is to be coupled to the gold film exposed from the opening OP3.

Figure 3:
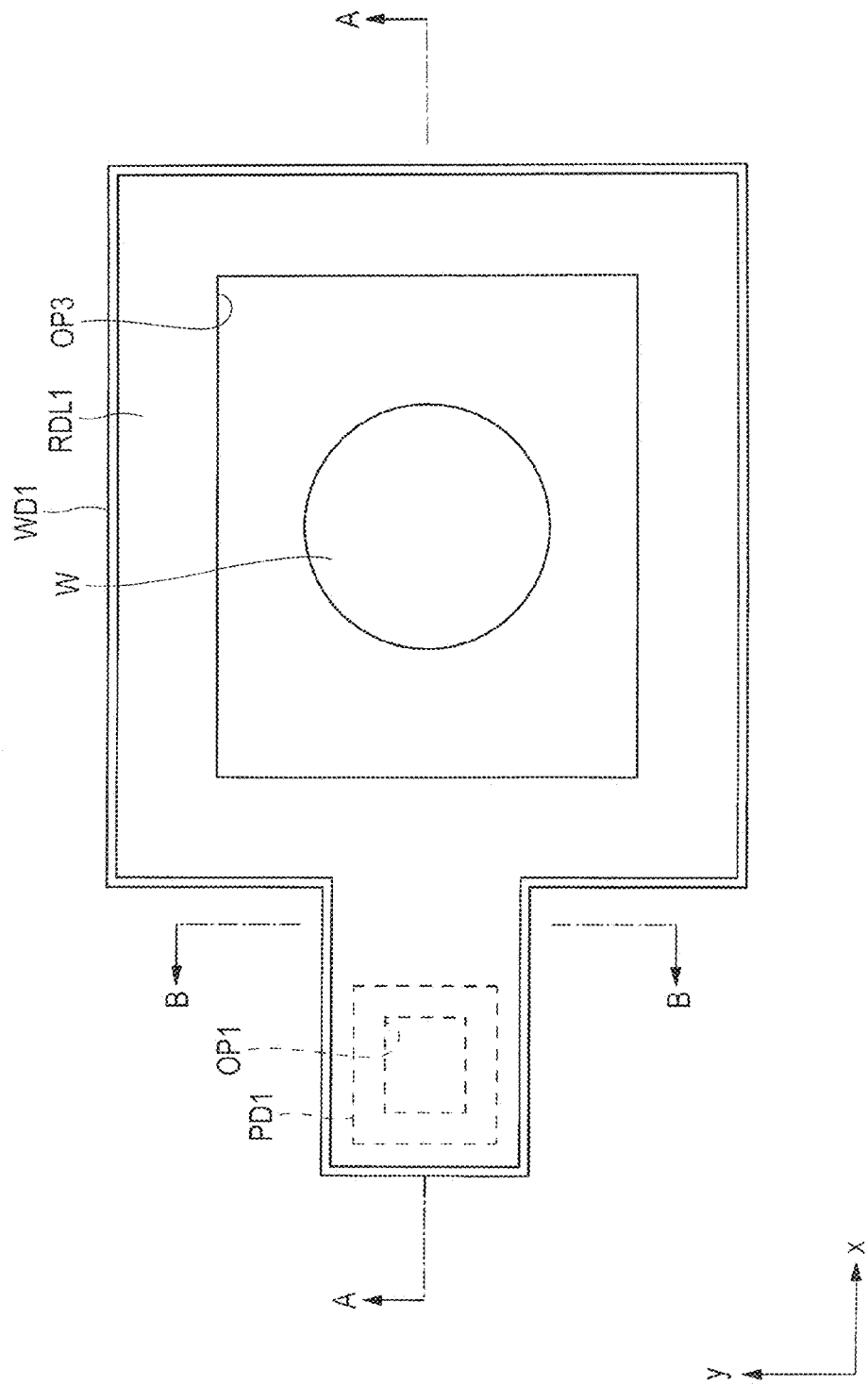
FIG. 3 is an expanded view of a partial region of the semiconductor chip illustrated in FIG. 2, the partial region corresponding to one redistribution layer.

FIG. 3 is an enlarged view of a partial region of the semiconductor chip CHP illustrated in FIG. 2, specifically an enlarged view of a region corresponding to one opening OP3. As illustrated in FIG. 3, an opening OP1 exposing part of a surface of a pad PD1 including, for example, an aluminum film is provided, and the redistribution layer RDL1 is provided so as to be electrically coupled to the pad PD1 via the opening OP1. The redistribution layer PDL1 extends it an x direction, and the opening OP3 is provided so as to expose a partial region of the redistribution layer RDL1, and a wire W including copper is electrically coupled to the redistribution layer RDL1 exposed from the opening OP3. Furthermore, an interconnection trench WD1 is provided so as to encapsulate the redistribution layer RDL1 in plan view.

Device Structure of Semiconductor Chip

Figure 4:
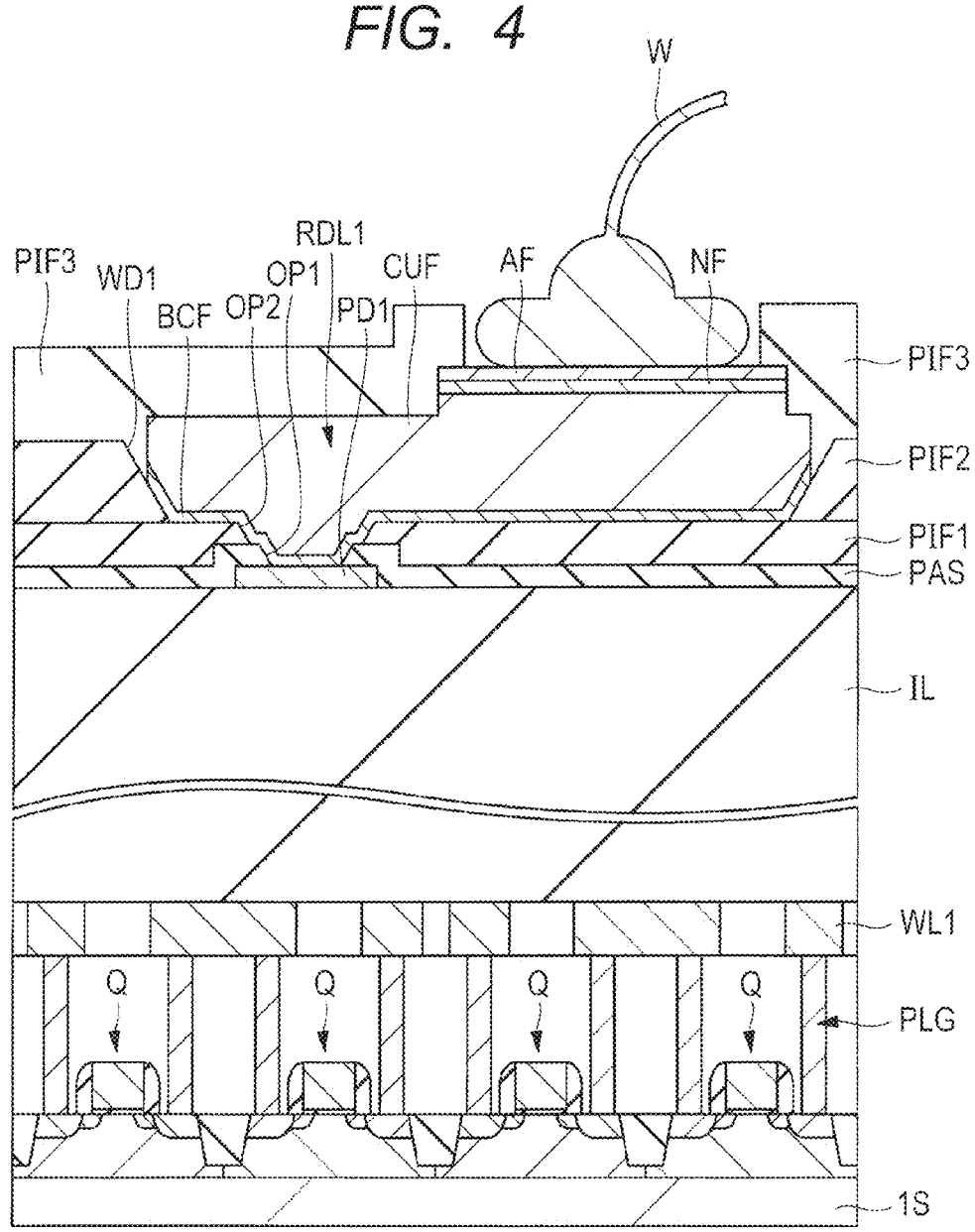
FIG. 4 is a section view along a line A-A in FIG. 3.

The device structure of the semiconductor chip CHP of the first embodiment is now described. FIG. 4 is a section view along a line A-A it FIG. 3, showing an exemplary device structure of the semiconductor device of the first embodiment. In particular, FIG. 4 corresponds to a section view in an interconnection length direction corresponding to the direction along which the redistribution layer extends in FIG. 3. As illustrated in FIG. 4, a plurality of field effect transistors Q configuring an integrated circuit are provided on a main surface of a semiconductor substrate 1S including, for example, silicon. An interlayer insulating film is provided so as to cover the field effect transistors Q, and plugs PLG are provided so as to be electrically coupled to the field effect transistors Q through the interlayer insulating film. Interconnections WL1 are provided by, for example, a damascene process on the interlayer insulating film having the plugs PLG. The interconnections WL1 are electrically coupled to the field effect transistors Q via the plugs PLG. In FIG. 4, an undepicted multilayer interconnection is provided on the interconnections WL1, and the top interlayer insulating film IL is provided so as to cover the multilayer interconnection layer.

As illustrated in FIG. 4, the pad PD1 including, for example, an aluminum alloy film is provided on the interlayer insulating film IL. Specifically, the pad PD1 is provided above the semiconductor substrate 1S, and the passivation film PAS including, for example, a silicon oxide film or a silicon nitride film is provided so as to cover the pad PD1. The opening OP1 is provided in the passivation film PAS, and part of the surface of the pad PD1 is exposed from the bottom of the opening OP1.

As illustrated in FIG. 4, the polyimide film PIF1 is provided on the passivation film PAS, and an opening OP2 is provided in the polyimide film PIF1. Furthermore, a polyimide film PIF2 is provided on the polyimide film PIF1, and the interconnection trench WD1 is provided in the polyimide film PIF2 so as to link with the opening OP2. Specifically, the opening OP2 in the polyimide film PIF1 is provided in communication with the opening OP1 in the passivation film PAS while also linking with the interconnection trench WD1 in the polyimide film PIF2.

The barrier conductor film BCF is provided from the surface of the pad PD1 exposed from the opening al to a region including the side face of the opening OP1, the inner wall (bottom and side face) of the opening OP2, and the inner wall (bottom and side face) of the interconnection trench WD1. The copper film CUF is provided on the barrier conductor film BCF so as to fill the opening OP1, the opening OP2, and the interconnection trench WD1. In this way, the redistribution layer RDL1 including the barrier conductor film BCF and the copper film CUF is provided over the inside of the opening OP1, the inside of the opening OP2, and the inside of the interconnection trench WD1. Furthermore, the redistribution layer RDL1 includes a nickel film NF and a gold film AF provided on a partial region of the surface of the copper film CUF. The polyimide film PIF3 having the opening OP3 is provided on the polyimide film PIF2 so as to cover the redistribution layer RDL1. The gold film AF as a part of the redistribution layer RDL1 is exposed from the bottom of the opening OP3. The wire W including, for example, copper as a main component is coupled to the surface of the gold film AF exposed from the opening OP3.

The term "main component" described herein refers to a material component contained in largest quantities among constitutional materials of an element. For example, "material including copper as a main component" means that copper is contained in largest quantities among constitutional materials of that element. The term "main component" is intentionally used herein to represent that an element is basically composed of copper but without excluding the case where the element further contains impurities, for example.

A material for the redistribution layer RDL1 is now described. Since the redistribution layer RDL1 is configured of the barrier conductor film BCF, the copper film CUT, the nickel film NF, and the gold film AF, a specific material for the barrier conductor film BCF is described below. The barrier conductor film BCF is formed of a film having a function of suppressing diffusion of interconnection materials (mainly copper) configuring the redistribution layer RDL1 into the polyimide films PIF1 to PIF3. For example, the barrier conductor film BCF can be formed of a titanium (Ti) film, a titanium nitride (TiN) film, a titanium tungsten (TiW) film, a chromium (Cr) film, a tantalum (Ta) film, a tungsten (W) film, a tungsten nitride (WN) film, a high-melting-point metal film, and a noble metal film. (including Pd, Ru, Pt, and Ni).

In the case of the titanium film., the thickness is desirably 100 nm or more. In the case of the titanium nitride film or the titanium tungsten film, the thickness is desirably 50 nm or more. In the case of the chromium film, the thickness is desirably 50 nm or more. In the case of the tantalum film, the tungsten film, or the tungsten nitride film, the thickness is desirably 20 nm or more. In the case of the high-melting-point metal film or the noble metal film, the thickness is desirably 50 nm or more.

The redistribution layer RDL1 has a thickness of, for example, about 3 to 20 μm, and an interconnection width of about 4 to 100 μm.

Figure 5:
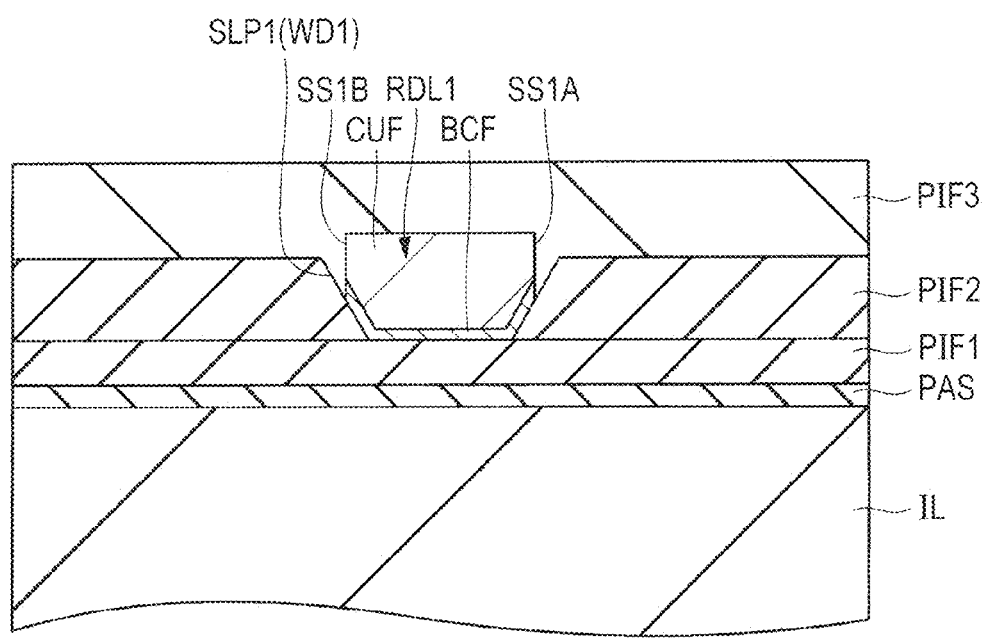
FIG. 5 is a section view along a line B-B in FIG. 3.

FIG. 5 is a section view along a line B-B in FIG. 3 Specifically, FIG. 5 corresponds to a section view in a y direction (interconnection width direction) intersecting with the x direction along which the redistribution layer RDL1 extends in FIG. 3. As illustrated in FIG. 5, the passivation film PAS is provided on the interlayer insulating film IL, and the polyimide film PIF1 s provided on the passivation film PAS. Furthermore, the polyimide film PIF2 having the interconnection trench WD1 is provided on the polyimide film PIF1. As shown in FIG. 5, a slope SLP1 is provided in the interconnection trench WD1. Specifically, in the first embodiment, the slope SLP1 is provided in the interconnection trench WD1 in sectional view in the interconnection width direction of the redistribution layer. The redistribution layer RDL1 including the barrier conductor film BCF and the copper film. CUF is disposed in the inside of the interconnection trench WD1, and the polyimide film PIF3 is provided on the polyimide film PIF2 while covering the redistribution layer RDL1. As illustrated in FIG. 5, an end of the barrier conductor film BCF is exposed from each of the side faces SS1A and SS1B of the redistribution layer RDL1.

In this way, as illustrated in FIGS. 2 to 5, the semiconductor chip CHP of the first embodiment includes the pad PD1, the passivation film PAS covering the pad PD1, and the opening OP1 exposing part of the surface of the pad PD1 from the passivation film PAS. The semiconductor chip CHP of the first embodiment further includes the opening OP2 in communication with the opening OP1, the polyimide film PIF1 (PIF2) having the interconnection trench WD1 linking with the opening OP2, and the redistribution layer RDL1 provided in the opening CPI, the opening OP2, and the interconnection trench WD1. The semiconductor chip CHP of the first embodiment further includes the polyimide film PIF3 covering the redistribution layer RDL1, and the opening OP3 exposing part of the redistribution layer RDL1 from the polyimide film PIF3. In this way, in the semiconductor chip CHP of the first embodiment, a redistribution layer structure to be electrically coupled to the pad PD1 is provided above the pad PD1.

Planar Layout Configuration of Redistribution Layers Adjacent to Each Other

Although the redistribution layer has been described with the redistribution layer RDL1 coupled to one pad PD1 in FIGS. 3 to 5, for example, two redistribution layers to be coupled to two pads are actually disposed side by side. Hence, a planar layout configuration and a sectional configuration in the interconnection width direction are now described with an exemplary configuration where two redistribution layers to be coupled to two pads are disposed side by side.

Figure 6:
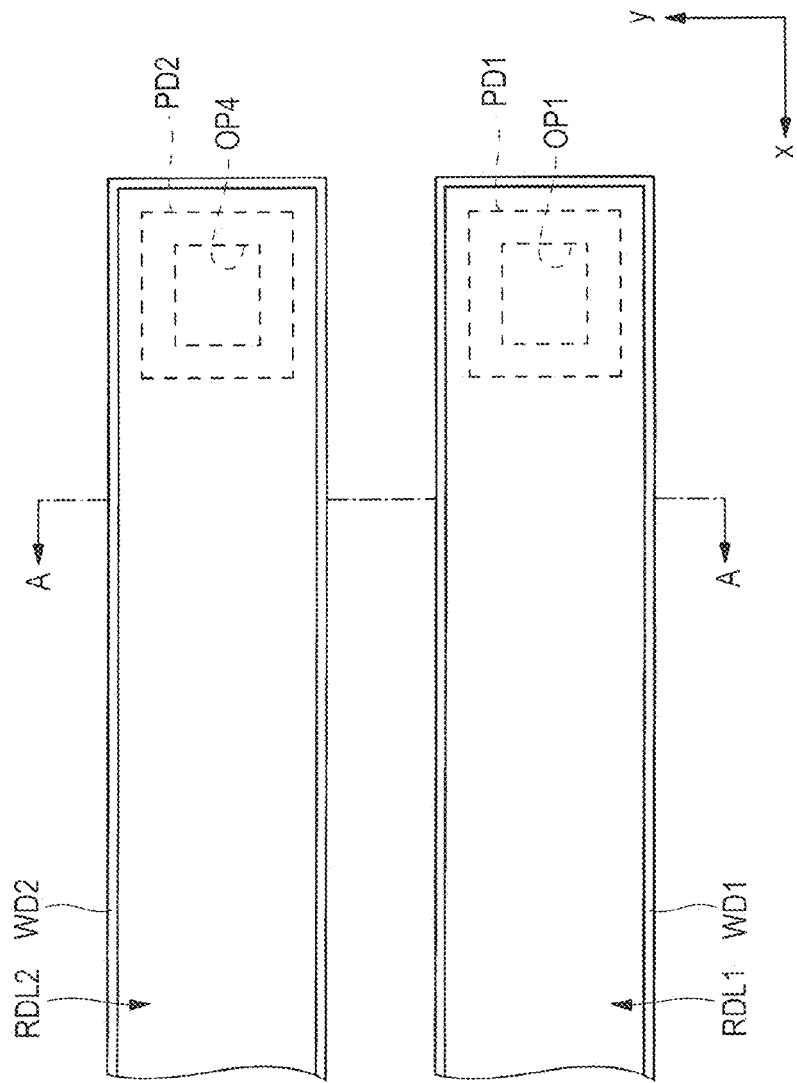
FIG. 6 is a schematic view illustrating two redistribution layers extending in an x direction while being arranged in a y direction.

FIG. 6 is a schematic view illustrating two redistribution layers RDL1 and RDL2 that extend in the x direction while being arranged in the y direction. As illustrated in FIG. 6, the pads PD1 and PD2 are disposed side by side in the y direction. The opening (DPI exposing a partial region of the surface of the pad PD1 is provided in the undepicted passivation film, and the redistribution layer RDL1 extends in the x direction so as to be electrically coupled to the pad PD1 via the opening OP1. Similarly, an opening OP4 exposing a partial region of the surface of the pad PD2 is provided in the undepicted passivation film, and the redistribution layer RDL2 extends in the x direction so as to be electrically coupled to the pad PD2 via the opening OP4. Consequently, the redistribution layer RDL1 and the redistribution layer RDL2 are disposed so as to extend. in the x direction parallel to each other.

Figure 7:
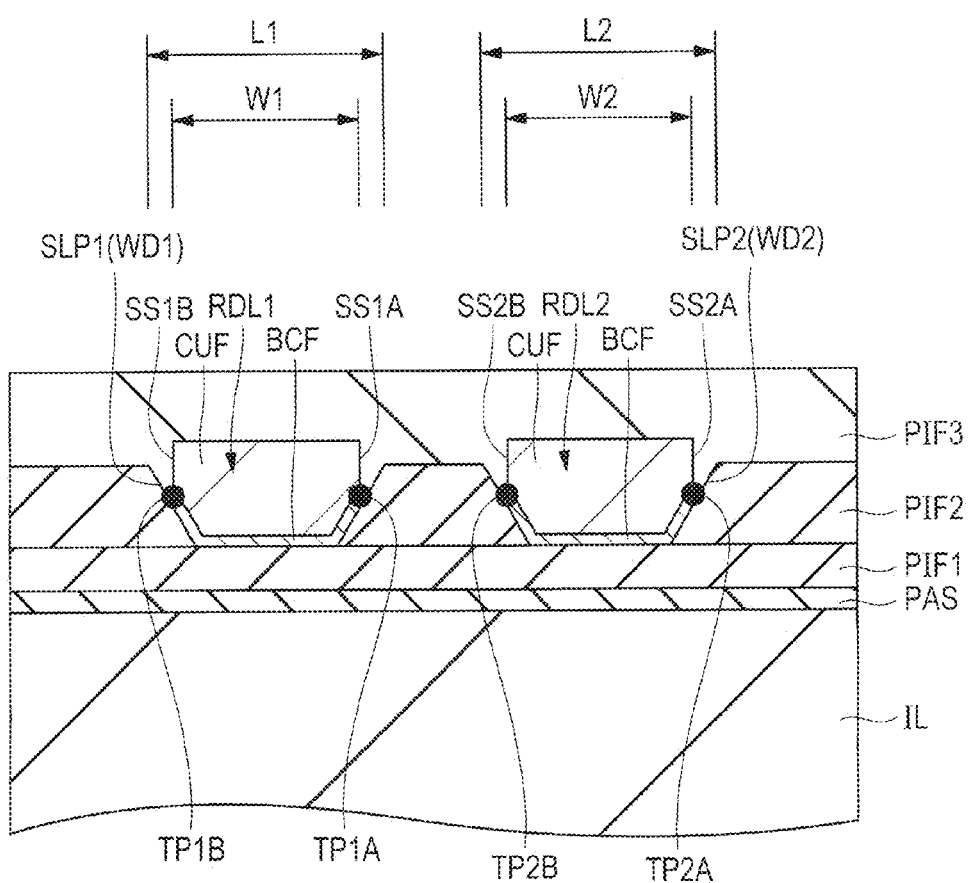
FIG. 7 is a section view along a line A-A in FIG. 6.

Sectional Configuration in Interconnection Width Direction of Redistribution Layers Adjacent to Each Other A sectional configuration in the interconnection width direction of the redistribution layer RDL1 and the redistribution layer RDL2 adjacent to each other is now described. FIG. 7 is a section view along a line A-A in FIG. 6. As illustrated in FIG. 7, the passivation film PAS is provided on the interlayer insulating film IL, and the polyimide film PIF1 is provided on the passivation film PAS. The polyimide film PIF2 is provided on the polyimide film PIF1, and the interconnection trench WD1 and an interconnection trench WD2 are provided in the polyimide film PIF2 while being disposed separately from each other. The interconnection trench WD1 has the slope SLP1, and the redistribution layer RDL1 including the barrier conductor film BCF and the copper film CUF is provided in the inside of the interconnection trench WD1 having the slope SLP1. Similarly, the interconnection trench WD2 has a slope SLP2, and the redistribution layer RDL2 including the barrier conductor film BCF and the copper film CUF is provided in the inside of the interconnection trench WD2 having the slope SLP2.

An end of the barrier conductor film BCF is exposed from each of the side faces SS1A and SS1B of the redistribution layer RDL1. Similarly, one end of the barrier conductor film BCF is exposed from one side face SS2B of the redistribution layer RDL2 opposed to the side face SS1A of the redistribution layer RDL1. Furthermore, the other end of the barrier conductor film BCF is exposed from the other side face SS2A of the redistribution layer RDL2. The polyimide film PIF3 is provided on the polyimide film PIF2 so as to cover the redistribution layers RDL1 and RDL2

Characteristic Features of First Embodiment

The characteristic point of the first embodiment is now described. As illustrated in FIG. 7, for example, the characteristic point of the first embodiment includes a point that the side face of the interconnection trench WD1 has the slope SLP1 in sectional view in the interconnection width direction, the maximum opening width L1 of the interconnection trench WD1 in the interconnection width direction is larger than the maximum interconnection width W1 of the redistribution layer RDL1 in the interconnection width direction, and the interconnection trench WD1 encapsulates the redistribution layer RDL1 in plan view (see FIG. 6). Similarly, as illustrated in FIG. 7, the characteristic point of the first embodiment includes a point that the side face of the interconnection trench WD2 has the slope SLP2 in sectional view in the interconnection width direction, the maximum opening width L2 of the interconnection trench WD2 in the interconnection width direction is larger than the maximum interconnection width W2 of the redistribution layer RDL2 in the interconnection width direction, and the interconnection trench WD2 encapsulates the redistribution layer RDL2 in plan view (see FIG. 6). As illustrated in FIG. 7, a point on the side face SS1A of the redistribution layer RDL1, at which the copper film CUF, the barrier conductor film BCF, and the polyimide film PIF3 are in contact with one another, is defined as triple point TP1A, and a point on the side face SS1B of the redistribution layer RDL1, at which the copper film CUF, the barrier conductor film BCF, and the polyimide film PIF3 are in contact with one another, is defined as triple point TP1B. Similarly, a point on the side face SS2A of the redistribution layer RDL2, at which the copper film CUF, the barrier conductor film BCF, and the polyimide film PIF3 are in contact with one another, is defined as triple point TP2A, and a point on the side face SS2B of the redistribution layer RDL12, at which the copper film CUF, the barrier conductor film BCF, and the polyimide film PIF3 are in contact with one another, is defined as triple point TP2B.

In a specific embodiment of the characteristic point of the first embodiment, for example, as illustrated in FIG. the side face SS1A and the side face SS1B of the redistribution layer RDL1 are in contact with the slope SLP1 of the interconnection trench WD1. In other words, the triple point TP1A on the side face SS1A and the triple point TP1B on the side face SS1B each exist on the slope SLP1 of the interconnection trench WD1. Similarly, the side face SS2A and the side face SS2B of the redistribution layer RDL2 are in contact with the slope SLP2 of the interconnection trench WD2. In other words, the triple point TP2A on the side face SS2A and the triple point TP2B on the side face SS2B exist on the slope SLP2 of the interconnection trench WD2.

Consequently, the redistribution layer structure of the first embodiment provides the following effects. For example, copper migration proceeds along the interface between the stacked films. In such a case, for example, as illustrated in FIG. 7, the first embodiment is designed such that the interface between the polyimide film PIF1 and the polyimide film PIF2 is prevented from being in contact with the copper film CUF by the barrier conductor film BCF having a function of preventing diffusion of copper. Hence, the redistribution layer structure of the first embodiment suppresses copper migration into the interface between the polyimide films PIF1 and PIF2 by the barrier conductor film BCF provided under the copper film CUF. For the redistribution layer RDL1, the end of the barrier conductor film BCF is exposed from each of the side faces SS1A and SS1B while being contact with the slope SLP1. Similarly, for the redistribution layer RDL2, the end of the barrier conductor film BCF is exposed from each of the side faces SS2A and SS2B while being in contact with the slope SLP2. Hence, for example, copper migration may occur along the interface between the polyimide films PIF2 and PIF3 existing between the side face SS1A of the redistribution layer RDL1 and the side face SS2B of the redistribution layer RDL2 because the interface is not covered with the barrier conductor film BCF. In other words, copper migration may occur along the interface between the polyimide films PIF2 and PIF3 between the triple points TP1A and TP1B.

In this regard, for example, it is assumed that the interface between the polyimide films PIF2 and PIF3 is provided along a straight line connecting the triple point TP1A to the triple point TP2B. In such a case, since the distance between. the triple points TP1A and TP2B is short, if copper migration occurs along the interface between the polyimide films PIF2 and PIF3, a substantial inter-conductor distance between the triple Point TP1A of the redistribution layer RDL1 and the triple point TP2B of the redistribution layer RDL2 is further reduced due to the copper migration. This means a reduction in insulating distance between the redistribution layers RDL1 and RDL2, leading to a reduction in dielectric strength voltage between the redistribution layers RDL1 and RDL2.

In contrast, the first embodiment, as illustrated in FIG. 7, the slope SLP1 is provided in the interconnection trench WD1 provided in the polyimide film PIF2, and the slope SLP2 is provided in the interconnection trench WD2, in sectional view in the interconnection width direction. In the first embodiment, the redistribution layer RDL1 is disposed in the interconnection trench WD1 while the redistribution layer RDL2 is disposed in the interconnection trench WD2 such that the triple point TP1A is in contact with the slope SLP1 while the triple point TP2A is contact with the slope SLP2. As a result, in the first embodiment, as illustrated in FIG. 7, the distance along the surface profile of the polyimide film PIF2 between the triple point TP1A (corresponding to a first end of the barrier conductor film BCF) and the triple point TP2B (corresponding to a second end of the barrier conductor film BCF) is longer than the straight-line distance between the triple points TP1A and TP2B. This means an increase in the distance between. the triple points TP1A and TP2B along the interface between the polyimide films PIF2 and PIF3. That is, copper migration proceeds along the interface between the Polyimide films PIF2 and PIF3. In consideration of this, the increase in the distance between the triple points TP1A and TP2B along the interface between the polyimide films PIF2 and PIF3 means that even if copper migration occurs along the interface, substantial inter-conductor distance between the triple point TP1A of the redistribution layer RDL1 and the triple point TP2B of the redistribution layer RDL2 can be maintained. Hence, according to the first embodiment, even if copper migration occurs along the interface between the polyimide films PIF2 and PIF3, the dielectric strength voltage between the redistribution layers RDL1 and RDL2 is less likely to be reduced, and thus the dielectric strength voltage between the redistribution layers RDL1 and RDL2 can be maintained. Consequently, according to the first embodiment, reliability of the semiconductor device can be improved.

In this way, the technical idea of the first embodiment is not an idea of actively suppressing copper migration, but an idea from the viewpoint of how the reduction in dielectric strength voltage between the redistribution layers due to the migration can be suppressed on the assumption that copper migration occurs. To embody such a technical idea, in the first embodiment, focusing on that if the distance along the interface along which migration proceeds can be increased while a certain distance between the redistribution layers is maintained, the reduction in dielectric strength voltage between the redistribution layers due to the migration can be suppressed, the above-described characteristic point is devised.

That is, the basic idea of the first embodiment is to increase the distance along the interface along which copper migration proceeds. As illustrated in FIG. 7, this basic idea is embodied as a configuration, in which the side face of the interconnection trench WD1 (WD2) has the slope SLP1 (SLP2), the maximum opening width L1 (L2) of the interconnection trench WD1 (WD2) is larger than the maximum interconnection width W1 (W2) of the redistribution layer RDL1 (RDL2), and the interconnection trench WD1 (WD2) encapsulates the redistribution layer RDL1 (RDL2).

In this way, according to the redistribution layer structure of the first embodiment, even if copper migration occurs, the substantial insulating distance between the redistribution layers can be maintained, and thus the reduction dielectric strength voltage between the redistribution layers can be suppressed. Consequently, according to the semiconductor device employing the redistribution layer structure of the first embodiment, reliability can be improved.

First Modification

Figure 8:
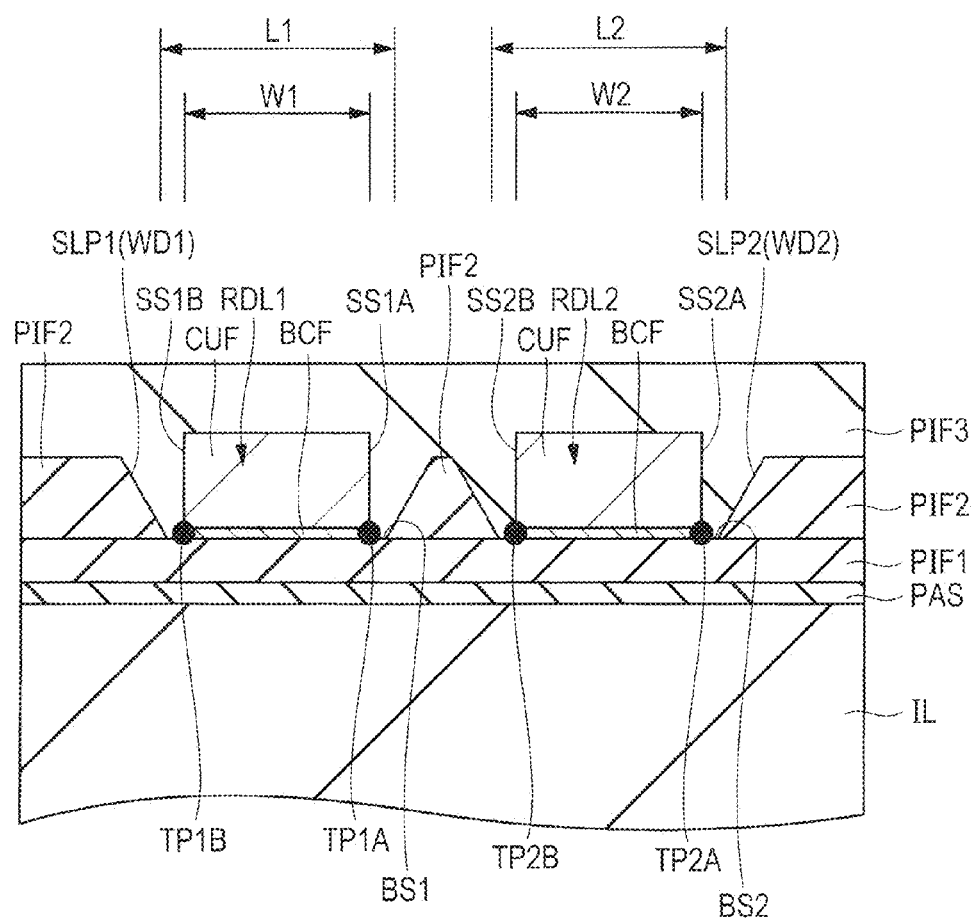
FIG. 8 is a section view illustrating a redistribution layer structure of a first modification in sectional view in an interconnection width direction.

The redistribution layer structure of a first modification is now described. FIG. 8 is a section view illustrating a redistribution layer structure of the first modification in sectional view in an interconnection width direction. In the redistribution layer structure illustrated in FIG. 8, unlike in FIG. 7, each of the side faces SS1A and SS1B of the redistribution layer RDL1 is in contact with the bottom BS1 of the interconnection trench WD1. In other words, in the redistribution layer structure of the first modification, the triple point TP1A and the triple point TP1B exist on the bottom BS1 of the interconnection trench WD1. That is, the end of the barrier conductor film BCF is in contact with the bottom BS1 of the interconnection trench WD1. Similarly, each of the side faces SS2A and SS2B of the redistribution layer RDL2 is in contact with the bottom BS2 of the interconnection trench WD2, and thus the triple point TP2A and the triple point TP2B exist on the bottom BS2 of the interconnection trench WD2. That is, the end of the barrier conductor film BCF is in contact with the bottom BS2 of the interconnection trench WD2.

In the redistribution layer structure of the first modification configured in this way, the distance between the triple points TP1A and TP2B along the interface between the polyimide films PIF2 and PIF3 can also be increased by providing the slope SLP1 and the slope SLP2 in the polyimide film PIF2 As a result, in the first modification, even if copper migration occurs, the substantial insulating distance between the redistribution layers RDL1 and RDL2 can also be maintained, and thus the reduction in dielectric strength voltage between the redistribution layers RDL1 and RDL2 can be suppressed. That is, according to the semiconductor device employing the redistribution layer structure of the first modification, reliability of the semiconductor device can also be improved.

In FIG. 8, the distance between the triple points TP1A and TP2B along the interface between the polyimide films PIF2 and PIF3 becomes longer by providing the slope SLP1 and the slope SLP2. On the other hand, as illustrated in FIG. 8, a linear interface between the polyimide films PIF1 and PIF2 also exists between the triple points TP1A and TP2B. Hence, in the first modification, copper migration may proceed along two types of paths, i.e., a pat along the interface between the polyimide films PIF2 and PIF3 and a path along the interface between the polyimide films PIF1 and PIF2. In this regard, in the first modification, a proceeding path of migration along the interface between the polyimide films PIF2 and PIF3 can be lengthened by the slope SLP1 and the slope SLP2. In the configuration of the first modification, however, the proceeding path of the migration along the interface between the polyimide films PIF1 and PIF2 is straightly provided. In the first modification, therefore, the basic idea of the first embodiment (the idea of lengthening the path along the interface) is not embodied on the proceeding path of migration along the interface between the polyimide films PIF1 and PIF2. Hence, in the first modification, it is concerned that the dielectric strength voltage between the redistribution layers RDL1 and RDL2 is reduced due to the migration along the interface between the polyimide films PIF1 and PIF2. In this regard, the reason why the interface between the polyimide films PIF1 and PIF2 exists is because the polyimide film PIF1 and the polyimide film PIF2 are separately formed. For example, for the redistribution layer structure of the first modification, if the polyimide film PIF1 and the polyimide film PIF2 are integrally formed as one film, the interface between the polyimide films PIF1 and PIF2 does not exist. Hence, in the first modification, it is desired to use the configuration, in which the polyimide film PIF1 and the polyimide film PIF2 are integrally formed as one film, together with the configuration, in which the proceeding path of the migration along the interface between the polyimide films PIF2 and PIF3 is increased by providing the slope SLP1 and the slope SLP2. According to such a configuration combination, the reduction in dielectric strength voltage between the redistribution layers RDL1 and RDL2 due to the copper migration can be suppressed securely and effectively.

Second Modification

Figure 9:
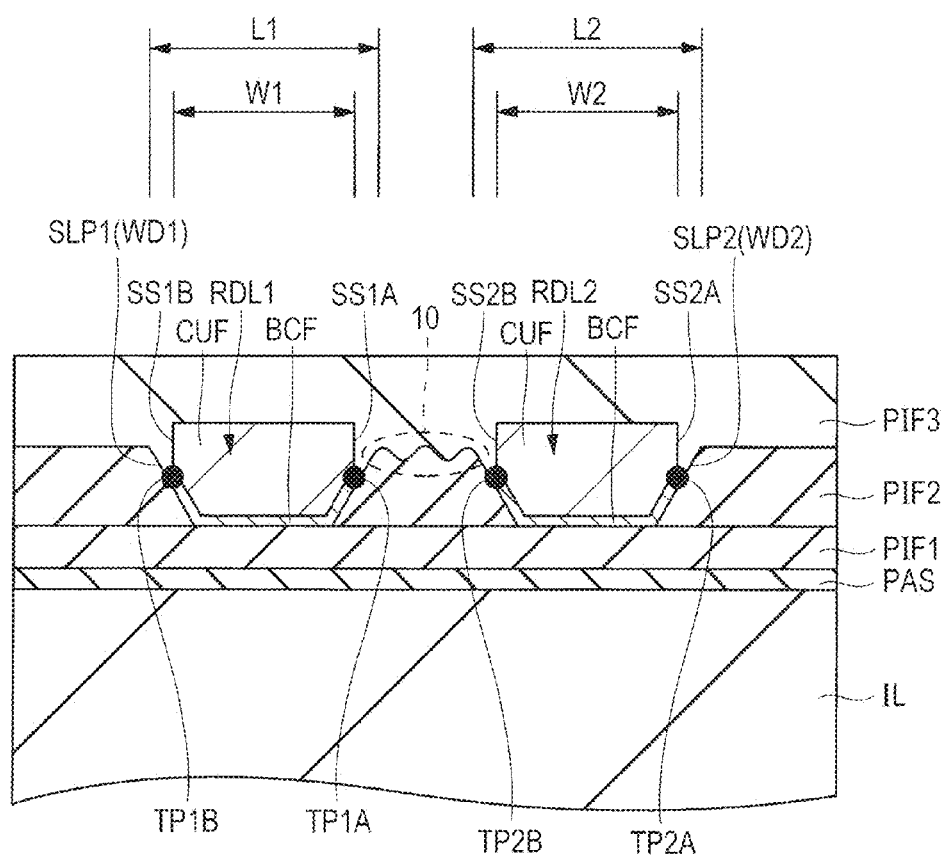
FIG. 9 is a section view illustrating a redistribution layer structure of a second modification in sectional view in the interconnection width direction.

The redistribution layer structure of a second modification is now described. FIG. 9 is a section view illustrating a redistribution layer structure of the second modification sectional view in an interconnection width direction. In the redistribution layer structure illustrated FIG. 9, the polyimide film PIF2 has the interconnection trench WD1 having the slope SLP1 and the interconnection trench WD2 having the slope SLP2, and an irregular shape 10 is provided on the surface of the polyimide film PIF2 between the interconnection trenches WD1 and WD2.

Consequently, according to the second modification, while the distance between the redistribution layers RDL1 and RDL2 s fixed, the distance between the triple points TP1A and TP2B along the interface between the polyimide films PIF2 and PIF3, along which the copper migration proceeds, can be further increased. In other words, the second modification has a characteristic point in that the distance between the triple points TP1A and TP2B can be further increased by providing the irregular shape 10 on the surface of the polyimide film PIF2.

The irregular shape 10 can be formed on the surface of the polyimide film PIF2 by using a photolithography process used to form the interconnection trenches WD1 and WD2 in the polyimide film PIF2. In particular, the distance between the interconnection trenches WD1 and WD2 is decreased to less than the resolution limit, thereby the irregular shape 10 can be naturally formed in accordance with intensity distribution (dark and light pattern) of unresolved light without providing a mask pattern for the irregular shape. For example, while the polyimide film PIF2 allows the maximum resolution of about 4 µm, the distance between the interconnection trenches WD1 and WD2 is set to at most the resolution limit, about 1 µm less, thereby the irregular shape 10 can be formed.

Furthermore, according to the second modification, since the irregular shape 10 is provided at the interface between the polyimide films PIF2 and PIF3, adhesion between the polyimide films PIF2 and PIF3 can be improved by an anchor effect caused by the irregular shape 10. Such improvement in adhesion between the polyimide films PIF2 and PIF3 means that a gap is less likely to be formed at the interface between the polyimide films PIF2 and PIF3. This means that copper migration is less likely to proceed along the interface between the polyimide films PIF2 and PIF3. Consequently, according to the second modification, the reduction in dielectric strength voltage between the redistribution layers RDL1 and RDL2 can be effectively suppressed by a synergetic effect of the increase in distance along the interface between the polyimide films PIF2 and PIF3 by the irregular shape 10, and the improvement in adhesion between the polyimide films PIF2 and PIF3 by the anchor effect caused by the irregular shape 10.

Method of Manufacturing Semiconductor Device

A method of manufacturing the semiconductor device of the first embodiment is now described with reference to drawings. In each of drawings illustrating a manufacturing process, a section view (left view) in the interconnection length direction of the redistribution layer and a section view (right view) in the interconnection width direction thereof are shown side by side.

Figure 10:
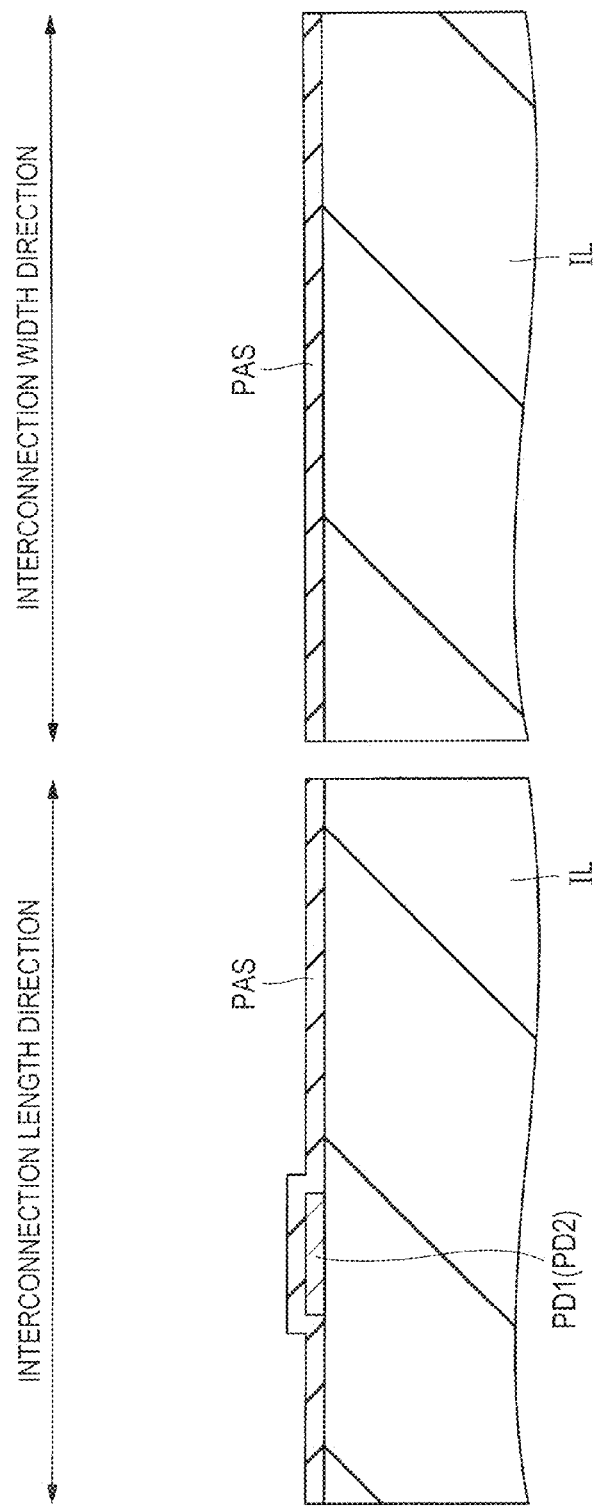
FIG. 10 is a section view illustrating a manufacturing process of the semiconductor device of the first embodiment.

First, for example, a semiconductor substrate including silicon is provided, and a plurality of field effect transistors are formed in the semiconductor substrate. Subsequently, a multilayer interconnection layer is formed on the semiconductor substrate having the field effect transistors. FIG. 10 illustrates the interlayer insulating film IL provided as the top layer of the multilayer interconnection layer. As illustrated in FIG. 10, a conductor film including, for example, an aluminum film or an aluminum alloy film (such as AlSi film or AlSiCu film) is formed on the interlayer insulating film IL, and the conductor film is patterned using a photolithography technique and an etching technique to form the pad PD1 (PD2).

Figure 11:
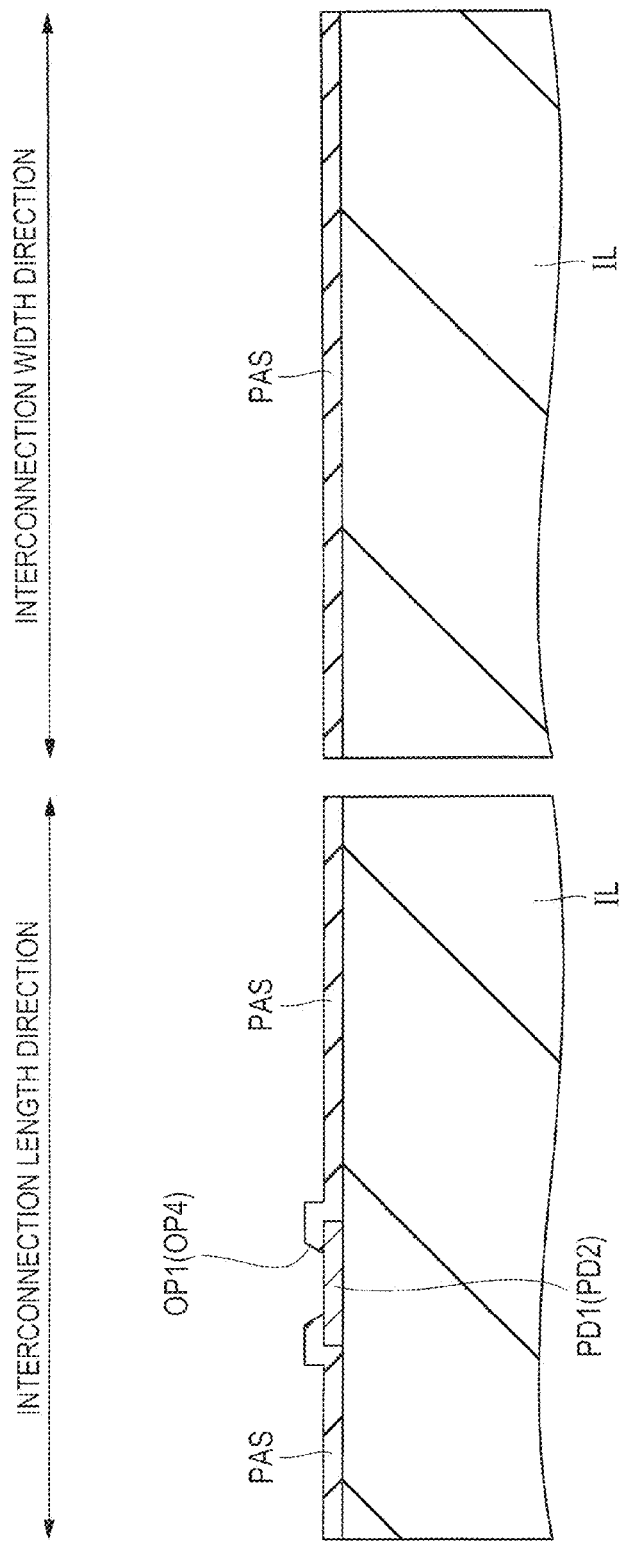
FIG. 11 is a section view illustrating the manufacturing process of the semiconductor device following FIG. 10.

Subsequently, the passivation film PAS is formed on the interlayer insulating film IL so as to cover the pad PD1 (PD2). The passivation film PAS is formed of, for example, a silicon oxide film or a silicon nitride film, and can be formed using a chemical vapor deposition (CVD) process, for example. Subsequently, as illustrated in FIG. 11, the opening OP1 (OP4) is formed in the passivation film PAS by using a photolithography technique and an etching technique. Through this operation, a partial region of the pad PD1 (PD2) is exposed from the bottom of the opening OP1 (OP4).

Figure 12:
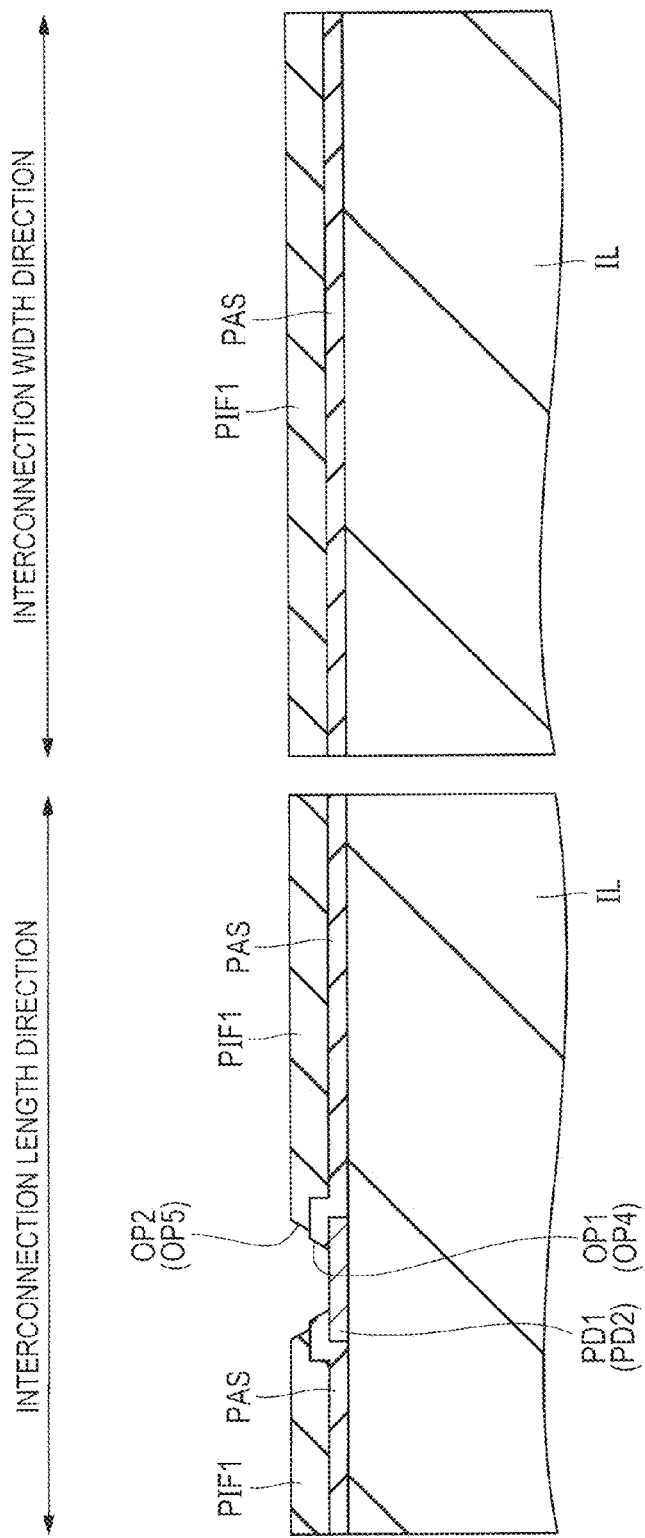
FIG. 12 is a section view illustrating the manufacturing process of the semiconductor device following FIG. 11.

Subsequently, as illustrated in FIG. 12, the photosensitive polyimide film PIF1 is formed on the passivation film PAS having the opening OP1 (OP4), and then the opening OP2 (OP5) is formed in the polyimide film PIF1 by using a photolithography technique. The opening OP2 (OP5) is formed so as to be in communication with the opening OP1 (OP4) formed the passivation film PAS.

Figure 13:
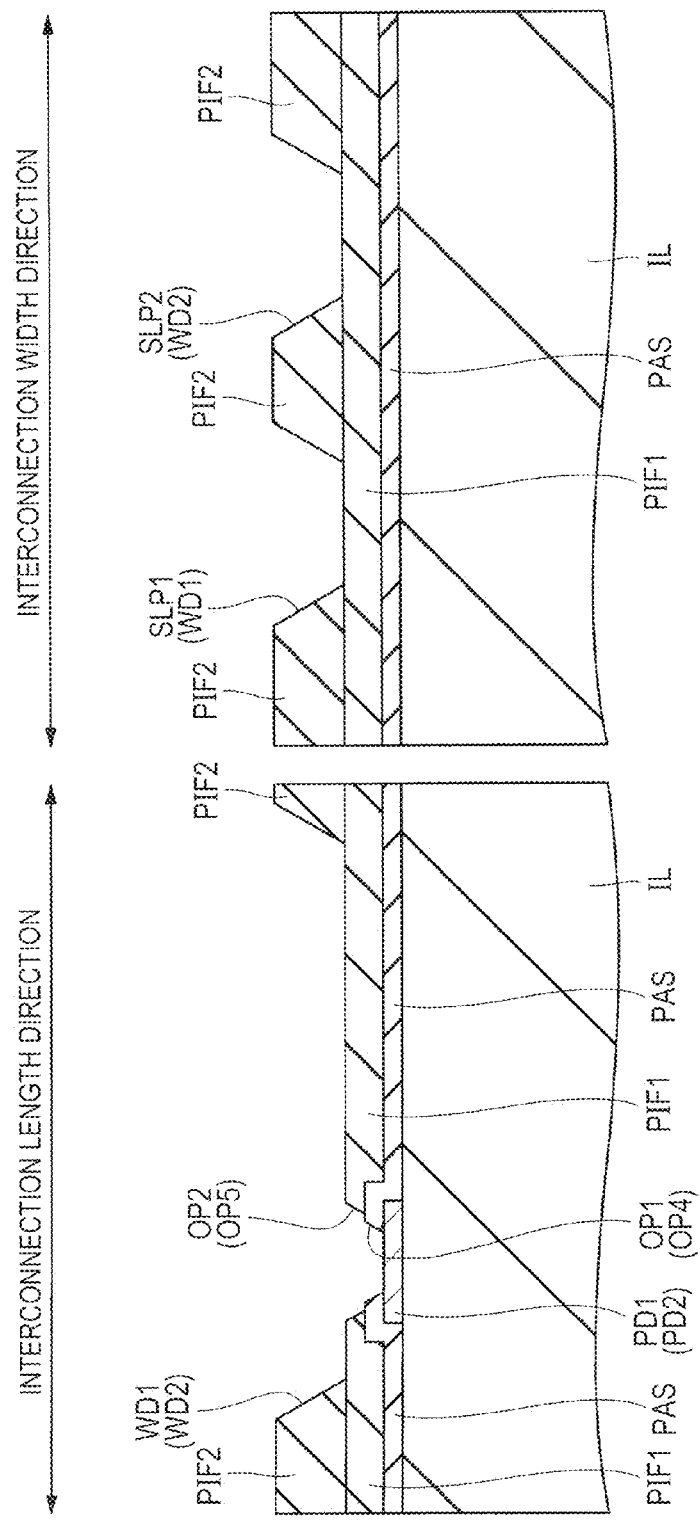
FIG. 13 is a section view illustrating the manufacturing process of the semiconductor device following FIG. 12.

As illustrated in FIG. 13, the polyimide film PIF2 is formed on the polyimide film PIF1 having the opening OP2 (OP5) Subsequently, the interconnection trench WD1 and the interconnection trench WD2 are formed in the polyimide film PIF2 by using a photolithography technique. The interconnection trench WD1 (WD2) is formed so as to link with the opening OP2 (OP5) formed in the polyimide film PIF1. Through this operation, as illustrated in the r view of FIG. 13, the slope SLP1 is formed on the side face of the interconnection trench WD1, and the slope SLP2 is formed on the side face of the interconnection trench WD2, in sectional view in the interconnection width direction. The inclination angle from a horizontal plane of each of the slope SLP1 and the slope SLP2 can be set to 30 to 60°, for example, is set to 45°. Specifically, since the inclination angle of the vertical plane is 90°, the inclination angle of each of the slopes SLP1 and SLP2 is smaller than 90°.

Figure 14:
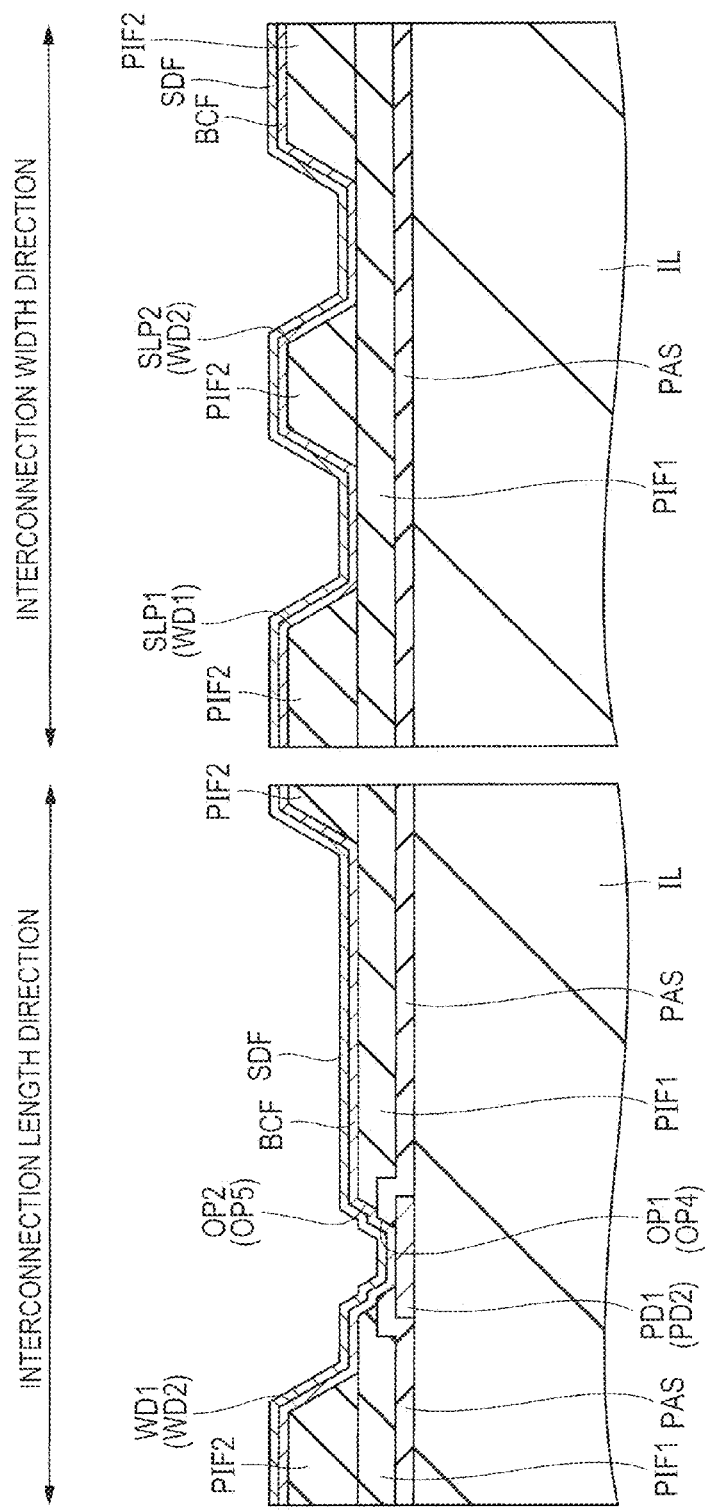
FIG. 14 is a section view illustrating the manufacturing process of the semiconductor device following FIG. 13.

Subsequently, as illustrated in FIG. 14, the barrier conductor film BCF is formed over the polyimide film PIF2, the inner wall of the opening OP1 (OP4), the inner wall of the opening OP2 (OP5), and the inner wall of the interconnection trench WD1 (WD2). The barrier conductor film BCF is formed of, for example, a titanium film or a titanium nitride film, and can be formed by using a sputtering process, for example. Subsequently, a seed film SDF including a copper film is formed on the barrier conductor film BCF by using a sputtering process.

Figure 15:
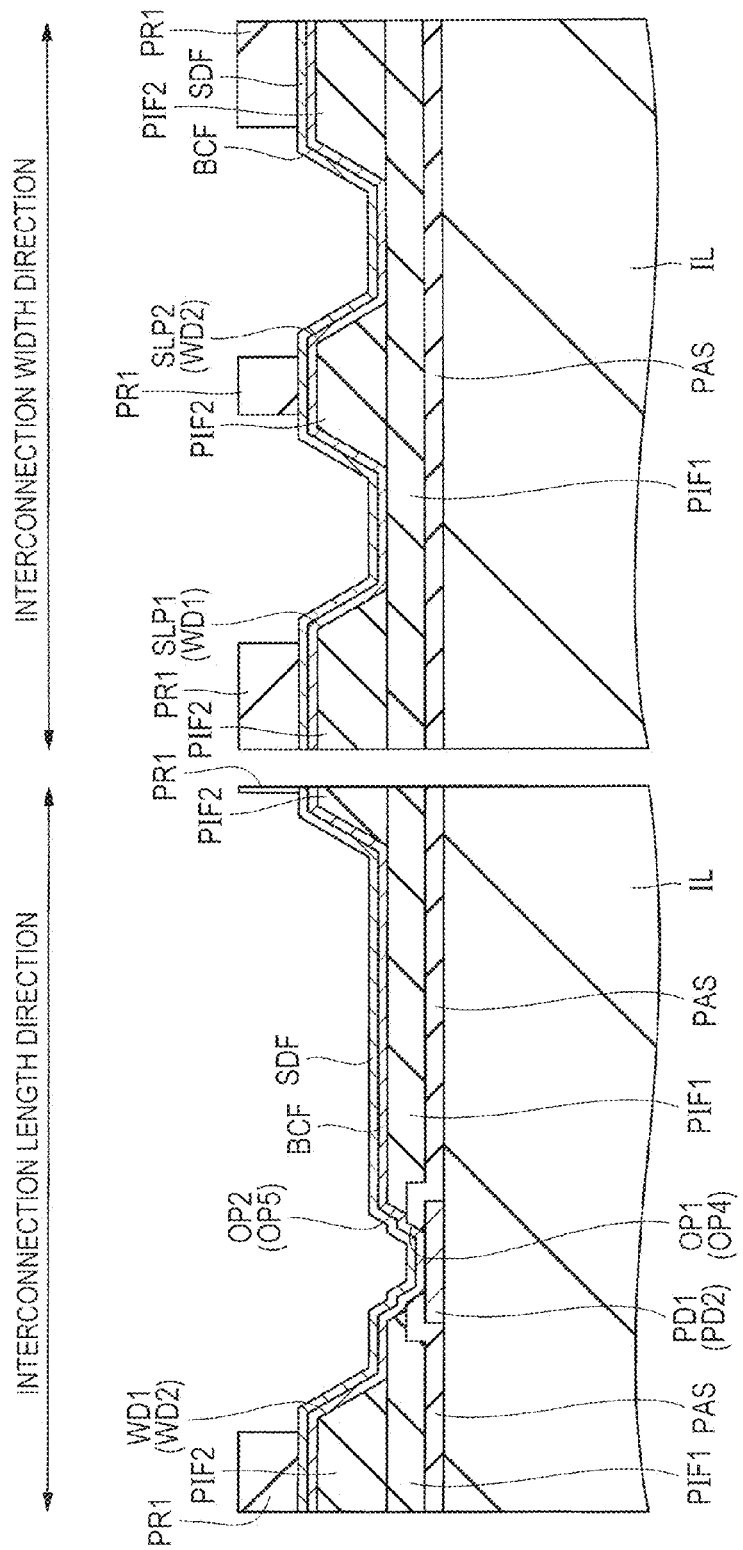
FIG. 15 is a section view illustrating the manufacturing process of the semiconductor device following FIG. 14.
Figure 16:
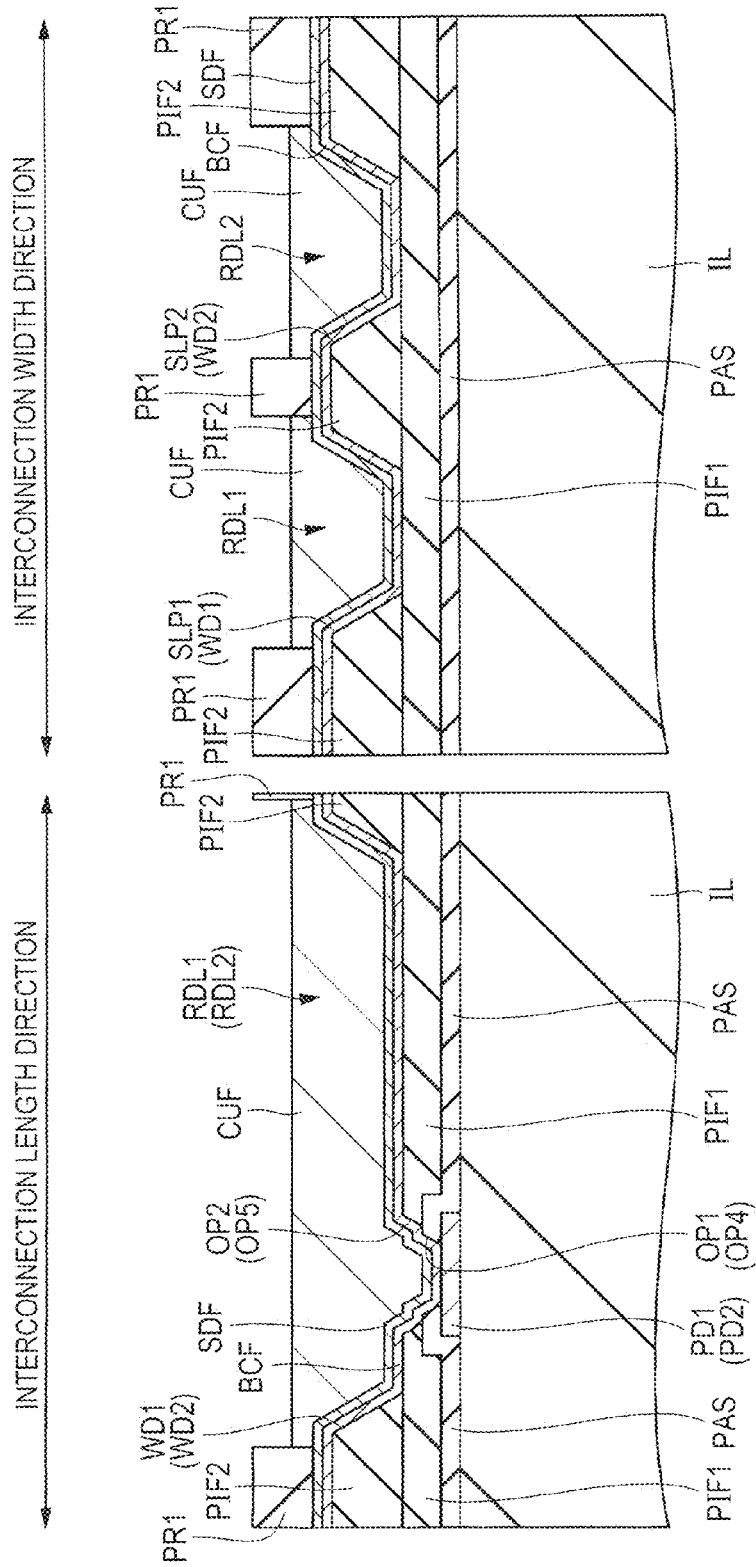
FIG. 16 is a section view illustrating the manufacturing process of the semiconductor device following FIG. 15.
Figure 17:
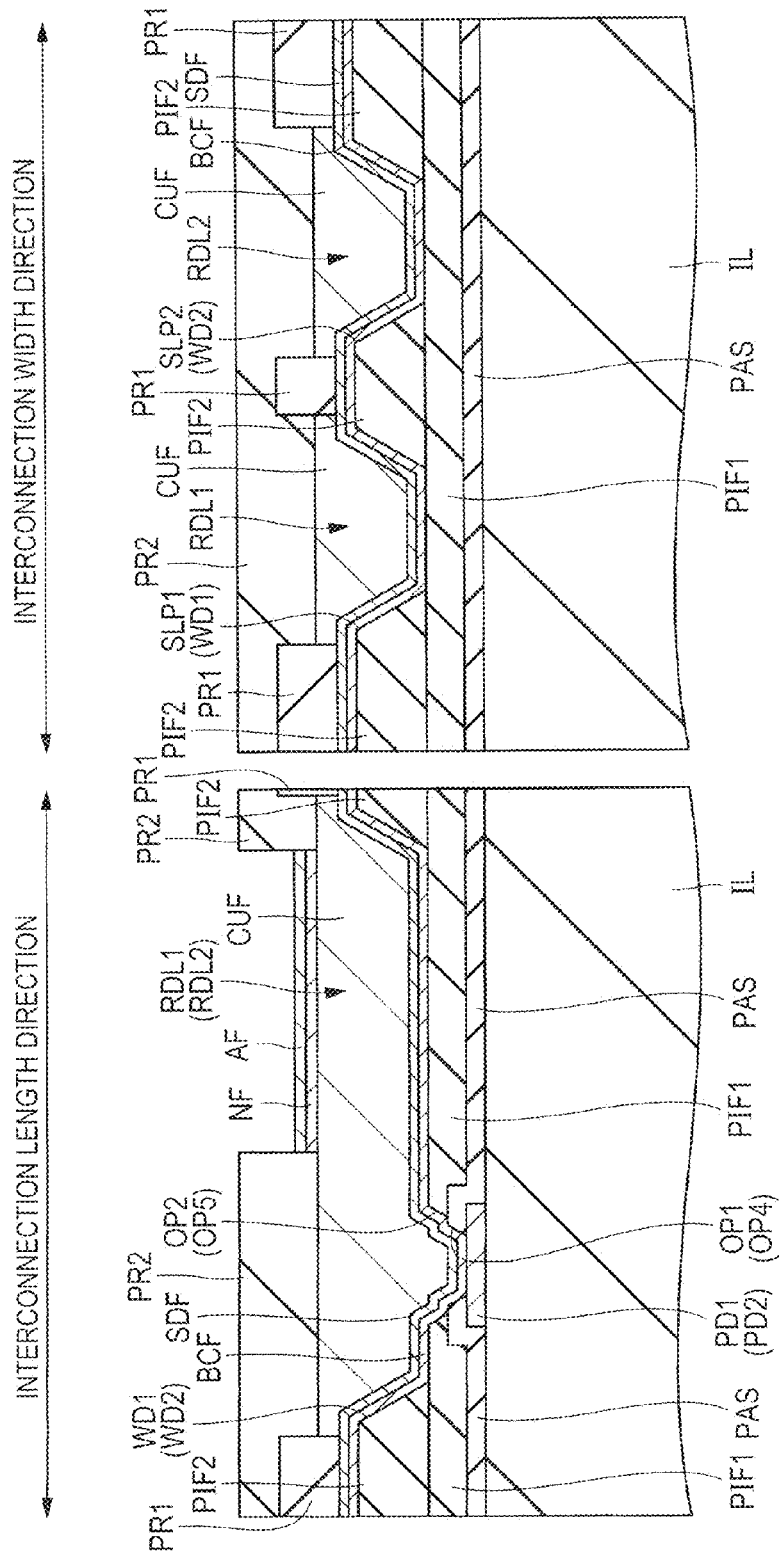
FIG. 17 is a section view illustrating the manufacturing process of the semiconductor device following FIG. 16.

Subsequently, as illustrated in FIG. 15, a resist film PR1 is formed on the seed film SDF, and is then patterned using a photolithography technique. The resist film PR1 is patterned so as to open a region in which the redistribution layer is to be formed. As illustrated in FIG. 16, the copper film CUF is formed over the barrier conductor film BCF by using, for example, an electroplating process so as to fill the opening OP1 (OP4) the opening OP2 (OP5), and the interconnection trench WD1 (WD2) Subsequently, as illustrated in FIG. 17, a resist film PR2 is formed over the resist film PR1 and the copper film CUF, and an opening region is formed in the resist film PR2 by using a photolithography technique. Part of the surface of the copper film CUF is exposed from the opening region. Subsequently, a stacked film of the nickel film NF and the gold film AF is formed on the copper film CUF exposed from the opening region formed in the resist film PR2 by using, for example, an electroplating process.

Figure 18:
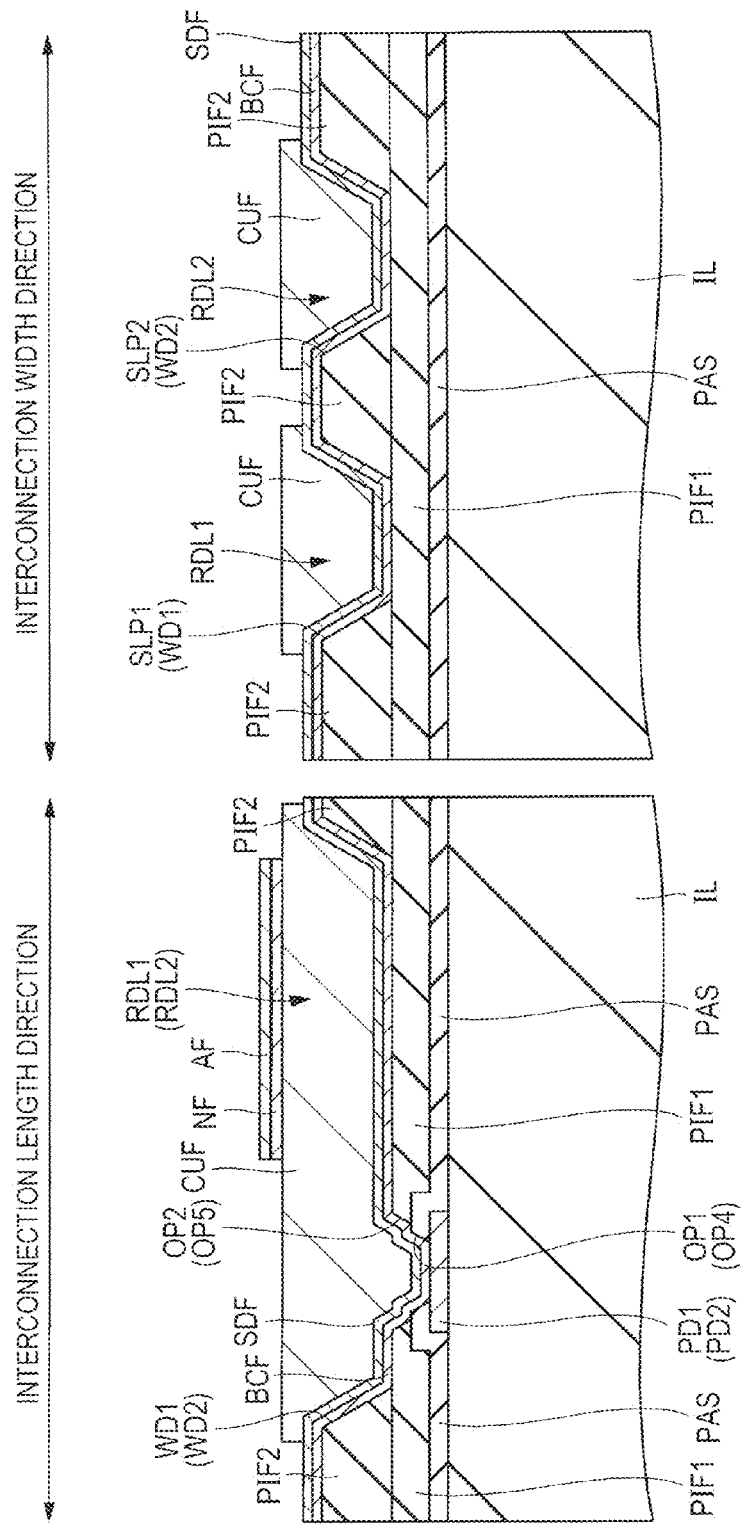
FIG. 18 is a section view illustrating the manufacturing process of the semiconductor device following FIG. 17.
Figure 19:
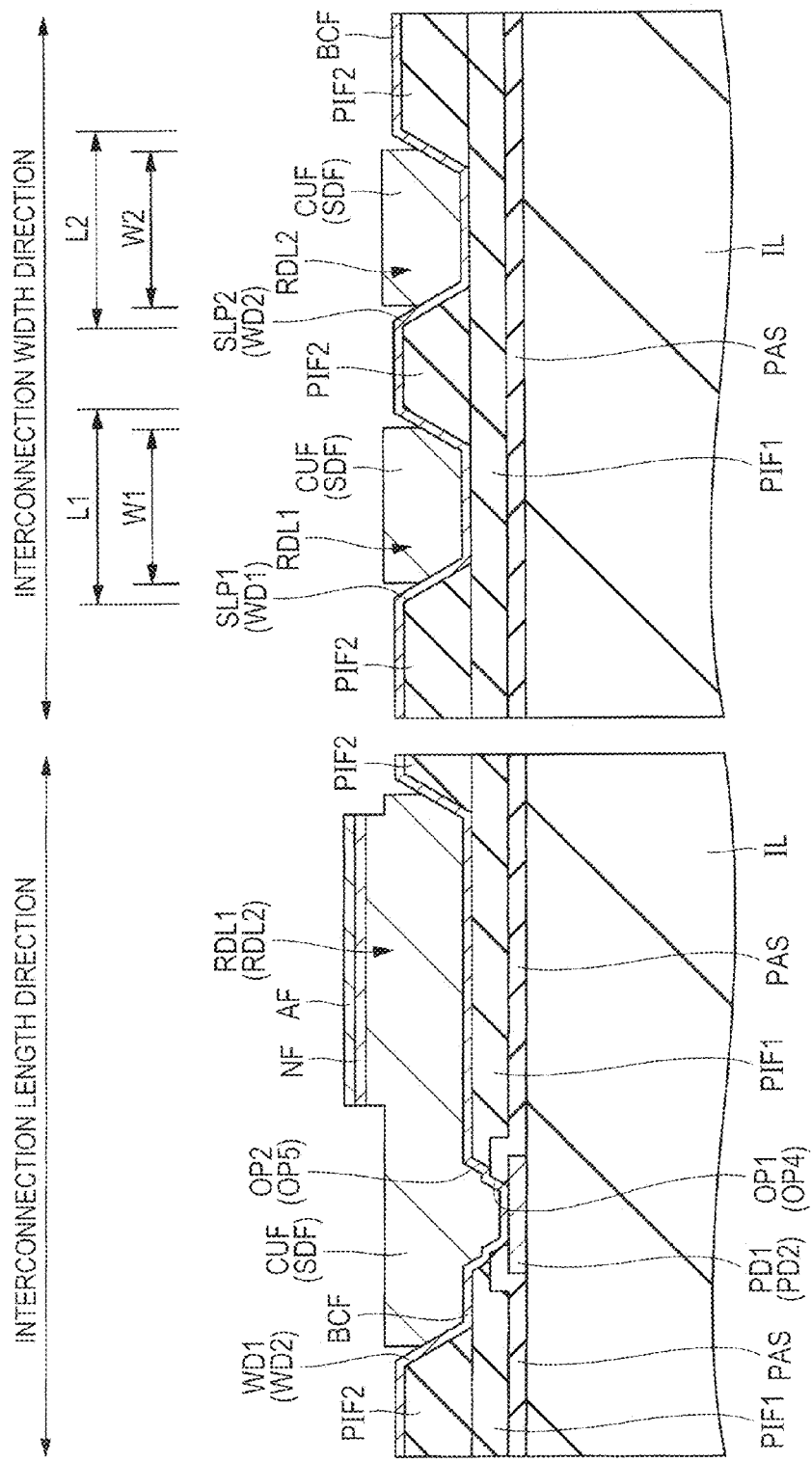
FIG. 19 is a section view illustrating the manufacturing process of the semiconductor device following FIG. 18.

Subsequently, as illustrated in FIG. 18, the resist film PR2 and the resist film PR1 are removed. Consequently, the redistribution layer RDL1 and the redistribution layer RDL2 can be formed. Subsequently, as illustrated in FIG. 19, the copper film CUF included in each of the redistribution layer RDL1 and the redistribution layer RDL2 is partially etched. As illustrated in FIG. 19, the etching step is performed such that the maximum opening width L1 of the interconnection trench WD1 in the interconnection width direction is larger than the maximum interconnection width W1 of the redistribution layer RDL1 in the interconnection width direction, and the interconnection trench WD1 encapsulates the redistribution layer RDL1 in plan view. Similarly, through the etching step, the maximum opening width L2 of the interconnection trench WD2 in the interconnection width direction is larger than the maximum interconnection width W2 of the redistribution layer RDL2 in the interconnection width direction, and the interconnection trench WD2 encapsulates the redistribution layer RDL2 in plan view. Specifically, as illustrated in FIG. 19, the side face of the redistribution layer RDL1 is in contact with the slope SLP1, and the side face of the redistribution. layer RDL2 is in contact with the slope SLP2, in sectional view in the interconnection width direction. In each of FIG. 19 and subsequent figures showing the manufacturing process, the copper film CUF and the seed film SDF are integrally shown as copper film CUF.

Figure 20:
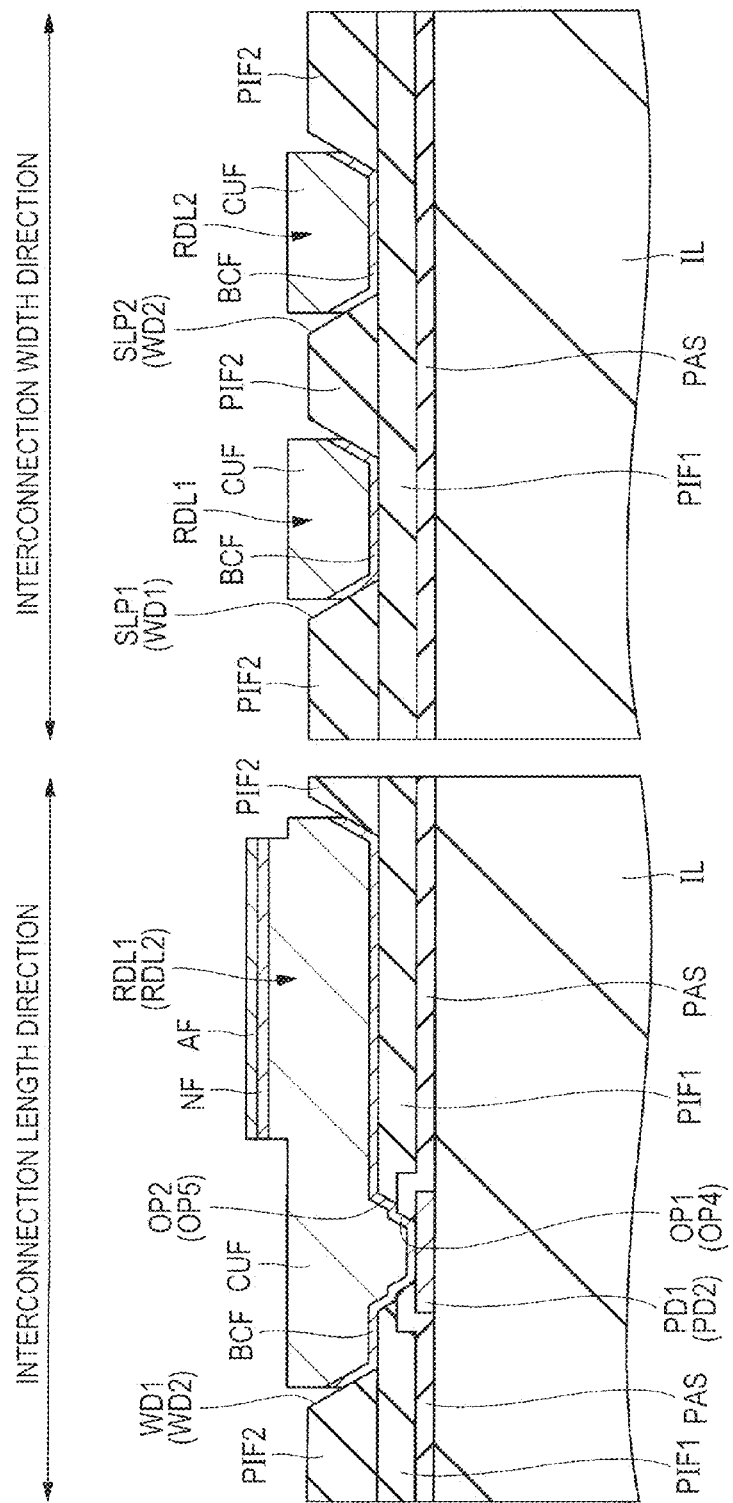
FIG. 20 is a section view illustrating the manufacturing process of the semiconductor device following FIG. 19.

As illustrated in FIG. 20, the barrier conductor film BCF exposed from each of the redistribution layers RDL1 and RDL2 is removed using wet etching, for example. As a result, as illustrated in FIG. 20, each end of the barrier conductor film BCF is exposed from the side face of the redistribution layer RDL1 and is in contact with the slope SLP1, in sectional view in the interconnection width direction. Similarly, each end of the barrier conductor film BCF is exposed from the side face of the redistribution layer RDL2 and is in contact with the slope SLP2.

Figure 21:
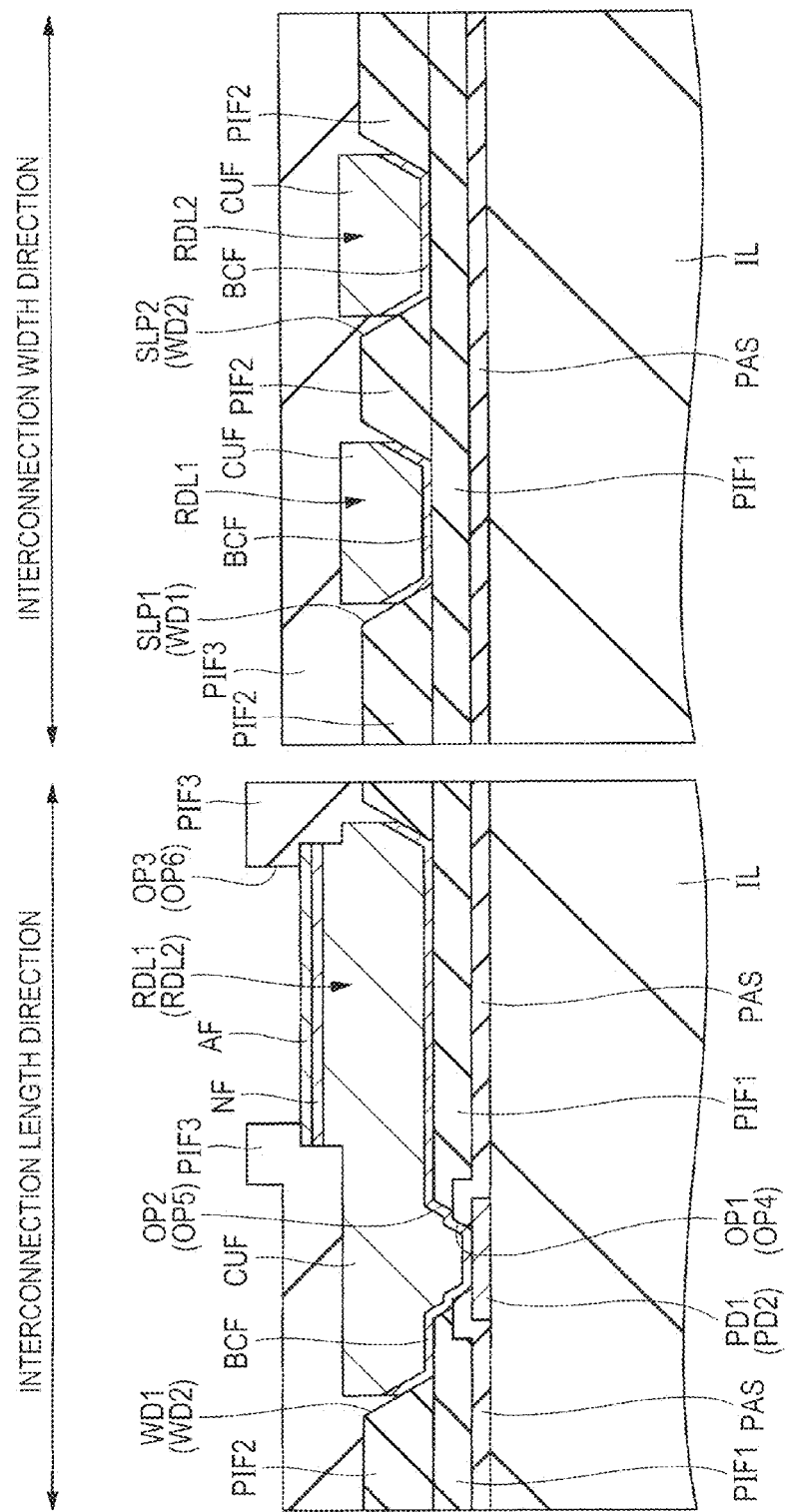
FIG. 21 is a section view illustrating the manufacturing process of the semiconductor device following FIG. 20.

Subsequently, as illustrated in FIG. 21, the polyimide film PIF3 is formed on the polyimide film PIF2 so as to cover the redistribution layer RDL1 and the redistribution layer RDL2. Subsequently, the opening OP3 (OP6) exposing part of the redistribution layer RDL1 is formed using a photolithography technique. Through this operation, the gold film AF is exposed from the opening OP3 (OP6).

In this way, the redistribution layer structure of the first embodiment can be formed. In the redistribution layer structure of the first embodiment, for example, as shown in the right view of FIG. 21, the redistribution layer RDL1 and the redistribution layer RDL2 adjacent to each other are formed such that the side face of the redistribution layer RDL1 is in contact with the slope SLP1 provided in the interconnection trench WD1, and the side face of the redistribution layer RDL2 is in contact with the slope SLP2 provided in the interconnection trench WD2. As a result, the redistribution layer structure of the first embodiment can increase the distance between the redistribution layers RDL1 and RDL2 along the interface between the polyimide films PIF2 and PIF3. According to the first embodiment, therefore, even if copper migration occurs along the interface between the polyimide films PIF2 and PIF3, the dielectric strength voltage between the redistribution layers RDL1 and RDL2 can be maintained. Consequently, the semiconductor device having the redistribution layer structure of the first embodiment can improve reliability.

Second Embodiment

Redistribution Layer Structure

A second embodiment will be described on an exemplary case where the technical idea of increasing the distance along the interface between the redistribution layers adjacent to each other is embodied by a configuration different from the configuration of the first embodiment.

Figure 22:
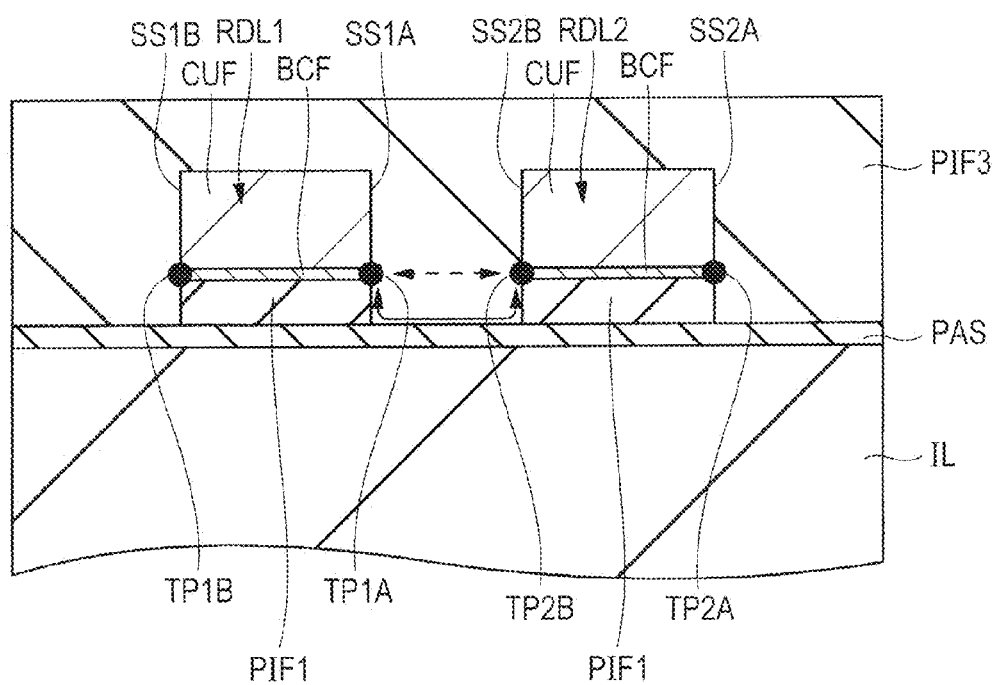
FIG. 22 is a section view illustrating a configuration of redistribution layers disposed adjacent to each other in a second embodiment.

FIG. 22 is a section view illustrating a configuration of the redistribution layer RDL1 and the redistribution layer RDL2 adjacent to each other in sectional view in an interconnection width direction. In FIG. 22, the passivation film PAS is provided on the interlayer insulating film IL, and polyimide films PIF1 are provided separately from each other on the passivation film PAS. The redistribution layer RDL1 including the barrier conductor film BCF and the copper film CUF is provided on one of the polyimide films PIF1 separately from each other, while the redistribution layer RDL2 including the barrier conductor film BCF and the copper film CUF is provided on the other of the polyimide films PIF1. Furthermore, the polyimide film PIF3 is provided so as to cover the redistribution layer RDL1 and the redistribution layer RDL2. In the redistribution layer structure of the second embodiment configured in this way, for example, focusing on the redistribution layer RDL1 illustrated in FIG. 22, a triple point TP1A, at which the copper film CUF, the barrier conductor film BCF, and the polyimide film PIF3 are in contact with one another, exists on the right side face SS1A of the redistribution layer RDL1. In addition, a triple point TP1B, at which the copper film CUF, the barrier conductor film BCF, and the polyimide film PIF3 are in contact with one another, exists on the left side face SS1B of the redistribution layer RDL1. Similarly, focusing on the redistribution layer RDL2 illustrated in FIG. 22, a triple point TP2A, at which the copper film CUF, the barrier conductor film BCF, and the polyimide film PIF3 are in contact with one another, exists on the right side face SS2A of the redistribution layer RDL2, and a triple point TP2B, at which the copper film CUF, the barrier conductor film BCF, and the polyimide film PIF3 are in contact with one another, exists on the left side face SS2B of the redistribution layer RDL2.

For example, as illustrated in FIG. 22, a characteristic point of the second embodiment includes a point that the polyimide film PIF1 under the redistribution layer RDL1 is provided only in a region that is planarly superposed on the redistribution layer RDL1. Similarly, for example, as illustrated in FIG. 22, the characteristic point of the second embodiment includes a point that the polyimide film PIF1 under the redistribution layer RDL2 is provided only in a region that is planarly superposed on the redistribution layer RDL2. In other words, the characteristic point of the second embodiment is at the width in the interconnection width direction of the polyimide film PIF1 under the redistribution layer RDL1 is equal to the width in the interconnection width direction of the redistribution layer RDL1, and the width in the interconnection width direction of the polyimide film PIF1 under the redistribution layer RDL2 is substantially equal to the width in the interconnection width direction of the redistribution layer RDL2.

Consequently, the redistribution layer structure of the second embodiment provides the following effects. Specifically, in the redistribution layer structure of the second embodiment, as illustrated in FIG. 22, a path along the interface between the triple point TP1A of the redistribution layer RDL1 and the triple point TP2B of the redistribution layer RDL2 is shown by a solid-line arrow. That is, according to the redistribution layer structure of the second embodiment, the path along the interface between the triple point TP1A of the redistribution layer RDL1 and the triple point. TP2B of the redistribution layer RDL2 can be made longer than a straight-line distance shown by a broken-line arrow. This means that even if copper migration occurs along the interface between the triple point TP1A of the redistribution layer RDL1 and the triple point TP2B of the redistribution layer RDL2, the dielectric strength voltage between the redistribution layer RDL1 and the redistribution layer RDL2 can be maintained.

For example, when the redistribution layer RDL1 and the redistribution layer RDL2 are provided on the polyimide film PIF1 provided continuously in the interconnection width direction, a path along the interface between the triple point TP1A of the redistribution layer RDL1 and the triple point TP2B of the redistribution layer RDL2 (interface between the Polyimide films PIF1 and PIF3) is the straight-line distance shown by the broken-line arrow in FIG. 22. On the other hand, according to the redistribution layer structure of the second embodiment, the path along the interface between the triple point TP1A of the redistribution layer RDL1 and the triple point TP2B of the redistribution layer RDL2 can be formed as the path shown by the solid-line arrow FIG. 22, which is longer than the straight-line distance shown by the broken-line arrow in FIG. 22. That is, according to the redistribution layer structure of the second embodiment, the path along the interface between the triple point TP1A of the redistribution layer RDL1 and the triple point TP2B of the redistribution layer RDL2 can be lengthened. According to the redistribution layer structure of the second embodiment, therefore, even if copper migration. occurs, the dielectric strength voltage between the redistribution layer RDL1 and the redistribution layer RDL2 can be maintained In this way, in the redistribution layer structure of the second embodiment, the polyimide film PIF1 under the redistribution layer RDL1 is provided only in the region that is planarly superposed on the redistribution layer RDL1, and the polyimide film PIF1 under the redistribution layer RDL2 provided only in the region that is planarly superposed on the redistribution layer RDL2. Consequently, according to the second embodiment, the reduction in dielectric strength voltage between the redistribution layers RDL1 and RDL2 due to copper migration can be suppressed, and thus reliability of the semiconductor device can be improved.

Method of Fabricating Redistribution Layer Structure

A method of fabricating the redistribution layer structure of the second embodiment is now described with reference to drawings. In each of FIGS. 23 to 25, a section view (left view) in the interconnection length direction of the redistribution layer and a section view (right view) in the interconnection width direction thereof are shown side by side.

Figure 23:
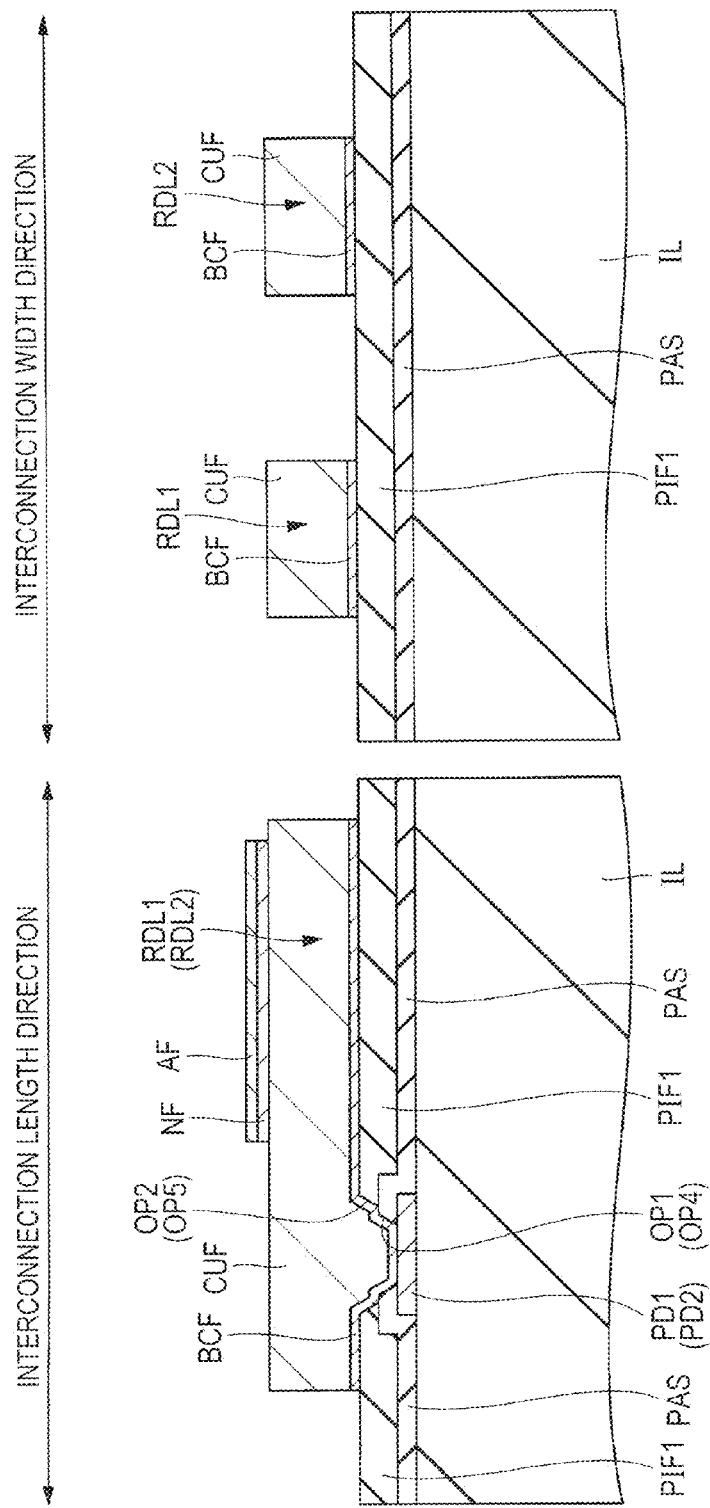
FIG. 23 is a section view Illustrating a manufacturing process of the semiconductor device of the second embodiment.

In a state shown in FIG. 23, a step of forming the passivation film PAS covering the pad PD1 (PD2), a step of forming the opening OP1 (OP4) exposing part of the surface of the pad PD1 (PD2) on the passivation film PAS, and a step of forming the polyimide film PIF1 on the passivation film PAS have been performed. Furthermore, in the state shown in FIG. 23, a step of forming the opening OP2 (OP5) in communication with the opening OP1 (OP4) on the polyimide film PIF1, and a step of forming the redistribution layer RDL1 (RDL2) that fills the opening OP1 (OP4) and the opening OP2 (OP5) and extends on the polyimide film PIF1 have also been performed. In such a state shown in FIG. 23, as shown in the right view of FIG. 23, the redistribution layer RDL1 and the redistribution layer RDL2 are provided on the polyimide film PIF1 that is continuously provided in the interconnection width direction.

Figure 24:
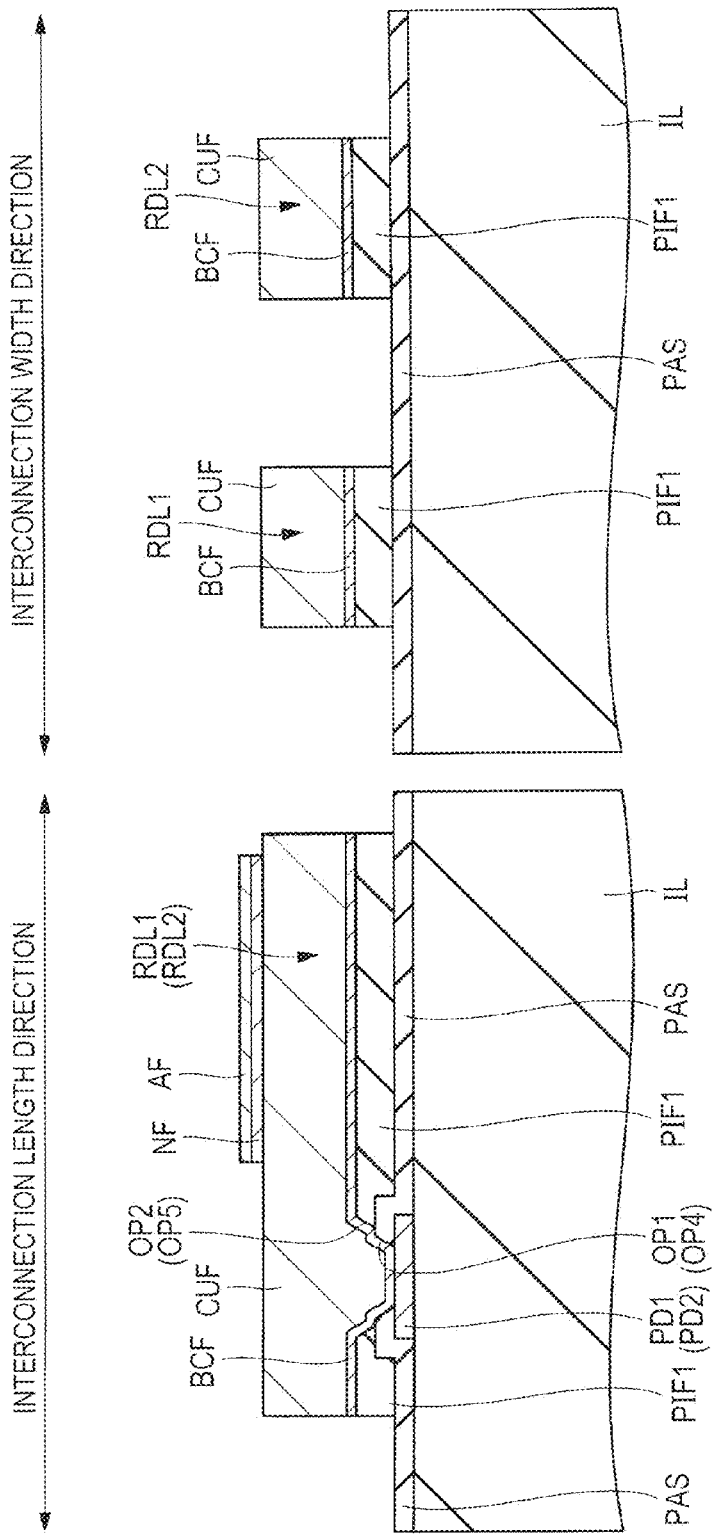
FIG. 24 is a section view illustrating the manufacturing process of the semiconductor device following FIG. 23.

Subsequently, as illustrated in FIG. 24, the polyimide film PIF1 is processed with the redistribution layer RDL1 and the redistribution layer RDL2 as a mask. Specifically, the polyimide film PIF1 is subjected to ashing using oxygen plasma with the redistribution layer RDL1 and the redistribution layer RDL2 as the mask. Consequently, as illustrated in FIG. 24, the polyimide film PIF1 can be formed under the redistribution layer RDL2 provided only in a region that is planarly superposed on the redistribution layer RDL1, and under the redistribution layer RDL2 provided only in a region that is planarly superposed on the redistribution layer RDL2.

Figure 25:
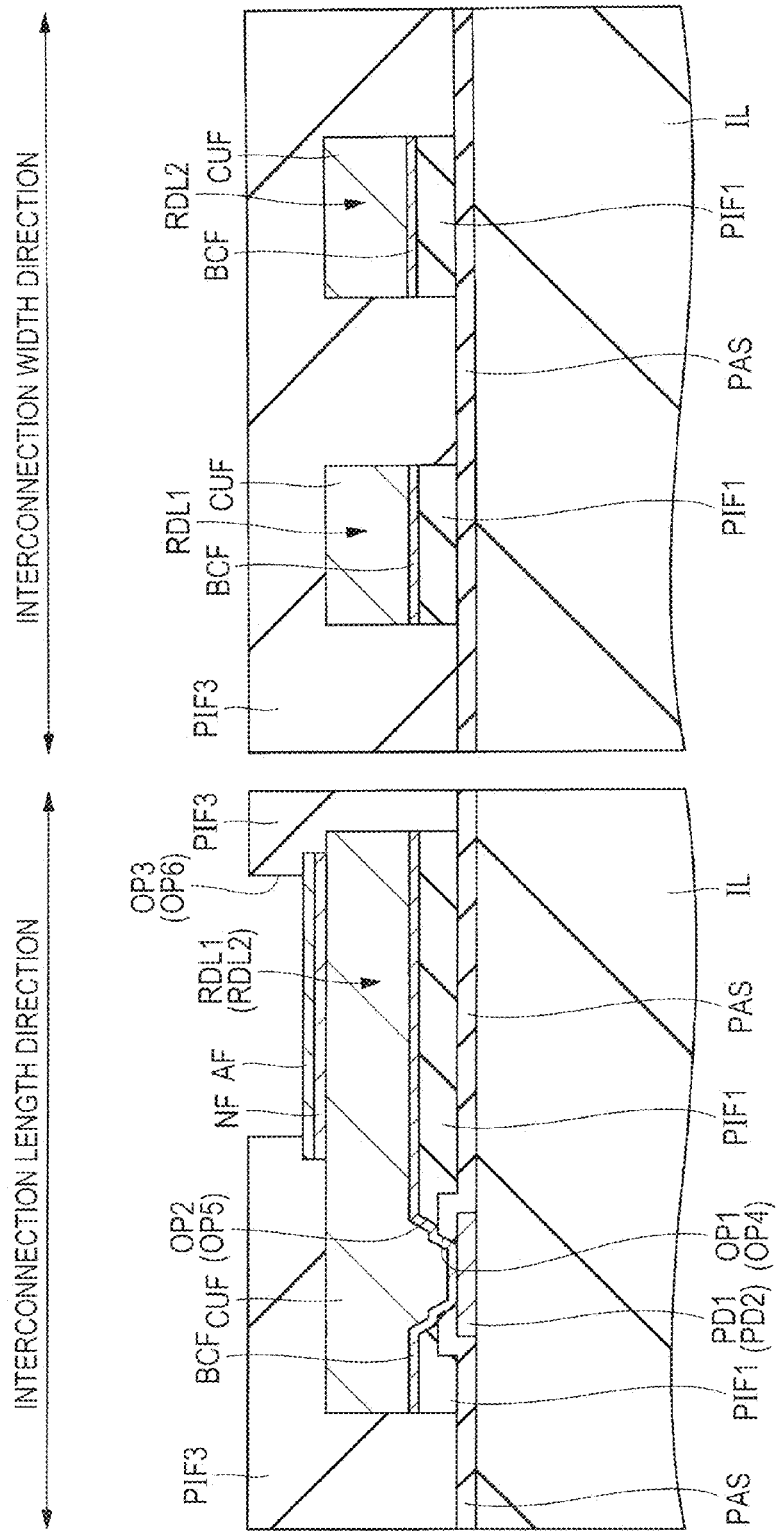
FIG. 25 is a section view illustrating the manufacturing process of the semiconductor device following FIG. 24.

Subsequently, as illustrated in FIG. 25, the polyimide film PIF3 covering the redistribution layer RDL1 and the redistribution layer RDL2 is formed, and then the opening OP3 (OP6) exposing part of the redistribution layer RDL1 (RDL2) is formed in the polyimide film PIF3. In this way, the redistribution layer structure of the second embodiment can be fabricated.

Although the invention achieved by the inventors has been described in detail according to some embodiments thereof hereinbefore, the invention should not be limited thereto, and it will be appreciated that various modifications or alterations thereof may be made within the scope without departing from the gist of the invention.

Modification

Although each of the above-described embodiments has been described with an exemplary case where a copper film is used as a major compositional film for the redistribution layer, the technical idea of the embodiment is not limited thereto. For example, the major compositional film for the redistribution layer may be configured of a silver film (Ag film). In such a case, since adhesion between the silver film and the copper wire is good, formation of the gold film for improving adhesion of the redistribution layer to the copper wire is not necessary. As a result, a manufacturing process of the semiconductor device can be simplified, and manufacturing cost can be reduced because the expensive gold film is not used.

The above-described embodiments include the following modes.

Supplementary Note 1

A semiconductor device, including:
a first pad;
an insulating film covering the first pad;
a first opening exposing part of a surface of the first pad from the insulating film;
a first polyimide film having a second opening in communication with the first opening;
a first interconnection filling the first opening and the second opening, and provided on the first polyimide film;
a second polyimide film covering the first interconnection; and
a third opening exposing part of the first interconnection from the second polyimide film,
wherein the first polyimide film is provided only in a region that is planarly superposed on the first interconnection.

Supplementary Note 2

The semiconductor device according to supplementary note 1, wherein when an interconnection length direction of the first interconnection is defined as first direction, and an interconnection width direction, intersecting with the first direction, of the first interconnection is defined as second direction, width in the second direction of the first polyimide film is equal to width in the second direction of the first interconnection.

Supplementary Note 3

A method of manufacturing a semiconductor device, the method including the steps of:
(a) forming an insulating film covering a first pad;
(b) forming a first opening in the insulating film, the first opening exposing part of a surface of the first pad;
(c) forming a first polyimide film over the insulating film;
(d) forming a second opening in the first polyimide film, the second opening being in communication with the first opening;
(e) forming a first interconnection filling the first opening and the second opening, and extending on the first polyimide film;
(f) processing the first polyimide film with the first interconnection as a mask;
(g) after the step (f), forming a second polyimide film covering the first interconnection, and
(h) forming a third opening in the second polyimide film, the third opening exposing part of the first interconnection.

Supplementary Note 4

The method according to supplementary note 3, wherein in the step (f), the first polyimide film is subjected to ashing with the first interconnection as a mask.

Supplementary Note 5

The method according to supplementary note 3, wherein after the step (f), the first polyimide film is provided only in a region that is planarly superposed on the first interconnection.

What is claimed is:

1. A semiconductor device, comprising:
a first pad;
an insulating film covering the first pad;
a first opening exposing part of a surface of the first pad from the insulating film;
a first polyimide film having a second opening linking with the first opening;
a second polyimide film having a first interconnection trench linking with the second opening;
a first interconnection provided in the first opening, the second opening, and the first interconnection trench;
a third polyimide film covering the first interconnection; and
a third opening exposing part of the first interconnection from the third polyimide film,
wherein when an interconnection length direction of the first interconnection is defined as first direction, and an interconnection width direction, intersecting with the first direction, of the first interconnection is defined as second direction, a first slope is provided on a side face of the first interconnection trench in sectional view in the second direction, and maximum opening width of the first interconnection trench in the second direction is larger than maximum interconnection width of the first interconnection in the second direction, and
wherein the first interconnection trench encapsulates the first interconnection in plan view.

2. The semiconductor device according to claim 1, wherein a side face of the first interconnection is in contact with the first slope.

3. The semiconductor device according to claim. 1, wherein a side face of the first interconnection is in contact with a bottom of the first interconnection trench.

4. The semiconductor device according to claim 1, wherein the first interconnection includes a first barrier conductor film and a first conductor film provided over the first barrier conductor film.

5. The semiconductor device according to claim 4, wherein. an end of the first barrier conductor film is exposed from the side face of the first interconnection.

6. The semiconductor device according to claim 5, wherein the end of the first barrier conductor film is in contact with the first slope.

7. The semiconductor device according to claim. 5, wherein the end of the first barrier conductor film is in contact with the bottom of the first interconnection trench.

8. The semiconductor device according to claim 1, further comprising a second pad, wherein the first polyimide film has a second interconnection trench separated from the first interconnection trench, wherein a second interconnection is provided in the second interconnection trench, the second interconnection being adjacent to the first interconnection and electrically coupled to the second pad, wherein in sectional view in the second direction, a second slope is provided on a side face of the second interconnection trench, and maximum opening width of the second interconnection trench in the second direction is larger than maximum interconnection width of the second interconnection in the second direction, and wherein the second interconnection trench encapsulates the second interconnection in plan view.

9. The semiconductor device according to claim 8, wherein the first interconnection includes a first barrier conductor film, and a first conductor film provided over the first barrier conductor film, wherein the second interconnection includes a second barrier conductor film, and a second conductor film provided over the second barrier conductor film, wherein a first end of the first barrier conductor film is exposed from a first side face of the first interconnection, and wherein a second end of the second barrier conductor film is exposed from a second side face of the second interconnection, the second side face being opposed to the first side face.

10. The semiconductor device according to claim 9, wherein a distance along a surface profile of the second polyimide film between the first end and the second end is longer than a straight-line distance between the first end and the second end.

11. The semiconductor device according to claim 8, wherein an irregular shape is provided on the surface of the second polyimide film between the first interconnection trench and the second interconnection trench.

12. The semiconductor device according to claim 1, wherein the first polyimide film and the second polyimide film are integrally provided.

13. A method of manufacturing a semiconductor device, the method comprising the steps of:

(a) forming an insulating film covering a first pad;

(b) forming a first opening in the insulating film, the first opening exposing part of a surface of the first pad;

(c) forming a first polyimide film over the insulating film;

(d) forming a second opening in the first polyimide film, the second opening linking with the first opening;

(e) forming a second polyimide film over the first polyimide film;

(f) forming a first interconnection trench in the second polyimide film, the first interconnection trench linking with the second opening;

(g) forming a first interconnection filling the first opening, the second opening, and the first interconnection trench;

(h) partially etching the first interconnection;

(i) after the step (h), forming a third polyimide film covering the first interconnection; and (j) forming a third opening in the third polyimide film, the third opening exposing part of the first interconnection, wherein when an interconnection length direction of the first interconnection is defined as first direction, and an interconnection width direction, intersecting with the first direction, of the first interconnection is defined as second direction, a first slope is formed on a side face of the first interconnection trench in sectional view in the second direction in the step (f), and wherein after the step (h), maximum opening width of the first interconnection trench in the second direction is larger than maximum interconnection width of the first interconnection the second direction, and the first interconnection trench encapsulates the first interconnection in plan view.

14. The method according to claim 13, wherein after the step (h), a side face of the first interconnection is in contact with the first slope in sectional view in the second direction.

15. The method according to claim 13, wherein the step (g) includes the steps of:

(g1) forming a first barrier conductor film over the second polyimide film, including the inside of the first opening, the inside of the second opening, and the inside of the first interconnection trench; and (g2) forming a first conductor film via the first barrier conductor film, the first conductor film filling the first opening, the second opening, and the first interconnection trench, thereby forming the first interconnection including the first barrier conductor film and the first conductor film, and wherein after the step (h), in sectional view in the second direction, an end of the first barrier conductor film is exposed. from a side face of the first interconnection, and the end of the first barrier conductor film is in contact with the first slope.

16. The method according to claim 13, wherein in the step (a), the insulating film covering a second pad is formed, wherein in the step (b), a fourth opening is formed in the insulating film, the fourth opening exposing part of a surface of the second pad, wherein the step (d), a fifth opening linking with the fourth opening is formed, wherein in the step (f), a second interconnection trench linking with the fifth opening is formed, and a second slope is formed on a side face of the second interconnection trench in sectional view in the second direction, wherein in the step (g), a second interconnection is formed, the second interconnection filling the fourth opening, the fifth opening, and the second interconnection trench, wherein in the step (h), the second interconnection is partially etched, wherein in the step (i), after the step (h) a third polyimide film covering the second interconnection is formed, and wherein in the step (j) a sixth opening is formed in the third polyimide film, the sixth opening exposing part of the second interconnection, and wherein after the step (h), maximum opening width of the second interconnection trench in the second direction is larger than maximum interconnection width of the second interconnection in the second direction, and the second interconnection trench encapsulates the second interconnection in plan view.

* * * * *